United States Patent
Chang et al.

(10) Patent No.: US 9,240,478 B2
(45) Date of Patent: Jan. 19, 2016

(54) 3D UTB TRANSISTOR USING 2D MATERIAL CHANNELS

(71) Applicants: Taiwan Semiconductor Manufacturing Company, Ltd., Hsin-Chu (TW); National Taiwan University, Taipei (TW)

(72) Inventors: Hung-Chih Chang, Taichung (TW); Pin-Shiang Chen, Taipei (TW); Chee-Wee Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/254,628

(22) Filed: Apr. 16, 2014

(65) Prior Publication Data

US 2015/0303299 A1    Oct. 22, 2015

(51) Int. Cl.
| | |
|---|---|
| H01L 23/52 | (2006.01) |
| H01L 29/78 | (2006.01) |
| H01L 29/16 | (2006.01) |
| H01L 29/20 | (2006.01) |
| H01L 29/26 | (2006.01) |
| H01L 29/66 | (2006.01) |
| H01L 21/02 | (2006.01) |

(52) U.S. Cl.
CPC ........ H01L 29/7827 (2013.01); H01L 21/0254 (2013.01); H01L 21/0259 (2013.01); H01L 21/02527 (2013.01); H01L 21/02568 (2013.01); H01L 29/1606 (2013.01); H01L 29/2003 (2013.01); H01L 29/26 (2013.01); H01L 29/66666 (2013.01)

(58) Field of Classification Search
USPC .................. 257/330, 369, E27.06, E27.062, 257/E27.112, 192, 202, 328, 350, 351; 438/138, 192, 199, 212; 977/938, 742, 977/842, 957
See application file for complete search history.

(56) References Cited

U.S. PATENT DOCUMENTS

| | | | |
|---|---|---|---|
| 7,670,887 B2 | 3/2010 | Bucher et al. | |
| 8,450,779 B2 | 5/2013 | Guo et al. | |
| 8,482,126 B2 | 7/2013 | Wada et al. | |
| 2009/0166686 A1* | 7/2009 | Hunt et al. | B82Y 10/00 257/288 |

OTHER PUBLICATIONS

Ayari, A., et al., "Realization and electrical characterization of ultrathin crystals of layered transition-metal dichalcogenides," Journal of Applied Science, 101, 014507 (2007), 6 pages.
Fang, Hui, et al. "Degenerate n-doping of few-layer transition metal dichalcogenides by potassium." Nano letters 13.5 (2013): pp. 1991-1995.

* cited by examiner

*Primary Examiner* — Dao H Nguyen
*Assistant Examiner* — Tram H Nguyen
(74) *Attorney, Agent, or Firm* — Slater & Matsil, L.L.P.

(57) ABSTRACT

A semiconductor device and a method of manufacture are provided. A substrate has a dielectric layer formed thereon. A three-dimensional feature, such as a trench or a fin, is formed in the dielectric layer. A two-dimensional layer, such as a layer (or multilayer) of graphene, transition metal dichalcogenides (TMDs), or boron nitride (BN), is formed over sidewalls of the feature. The two-dimensional layer may also extend along horizontal surfaces, such as along a bottom of the trench or along horizontal surfaces of the dielectric layer extending away from the three-dimensional feature. A gate dielectric layer is formed over the two-dimensional layer and a gate electrode is formed over the gate dielectric layer. Source/drain contacts are electrically coupled to the two-dimensional layer on opposing sides of the gate electrode.

20 Claims, 21 Drawing Sheets

3D UTB TRANSISTOR USING 2D MATERIAL CHANNELS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
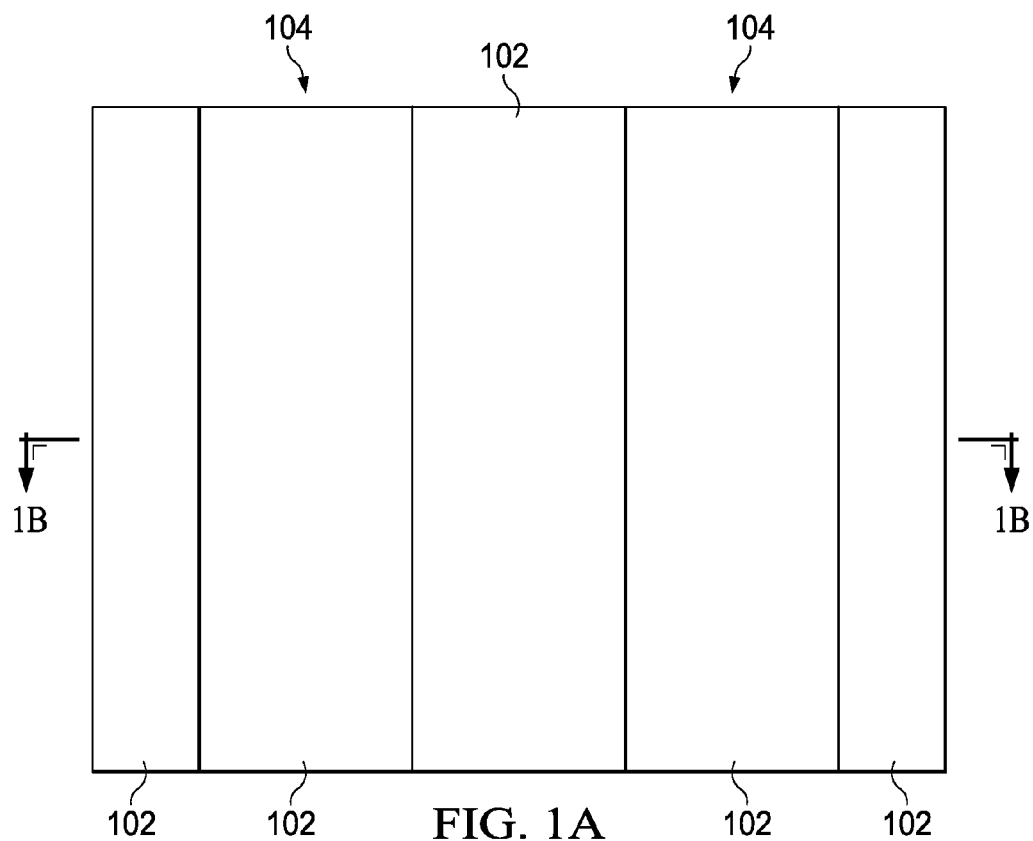
FIGS. 1A-4B illustrate various plan views and cross-sectional views of a fabrication process of a device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments such as those described herein provide an ultra-thin body (UTB) device by using three dimensional (3D) structures with two dimensional (2D) materials. For example, embodiments such as those described below utilize 3D structures such as trenches and fins formed in a dielectric layer. Suitable 2D materials include graphene, transition metal dichalcogenides (TMDs), and boron nitride (BN), and include one to a few (such as less than about monolayers) monolayers of material. Generally, 2D materials are monolayers of material held together by chemical bonds. Monolayers may be stacked upon each other to form a 2D material layer comprising individual monolayers. For example, individual monolayers of graphene, TMDs, and/or BN may be stacked to create a 2D material layer.

The use of the 3D features with the 2D materials allow formation of devices having a much smaller footprint. For example, a transistor having an UTB 2D material layer may be formed having a larger gate width while requiring a smaller footprint as compared to other types of transistors. Additionally, the use of 2D materials allows UTB devices that provide improved gate control.

FIGS. 1A-4B illustrate various intermediate stages of fabrication of a semiconductor device having vertical channel structures in accordance with some embodiments. FIGS. 1A-4B illustrate the cross-sectional views and plan views, wherein the "A" figures represent the plan view and the "B" figures represent the cross-sectional view along the B-B line of the respective "A" figure.

Figure 1B:
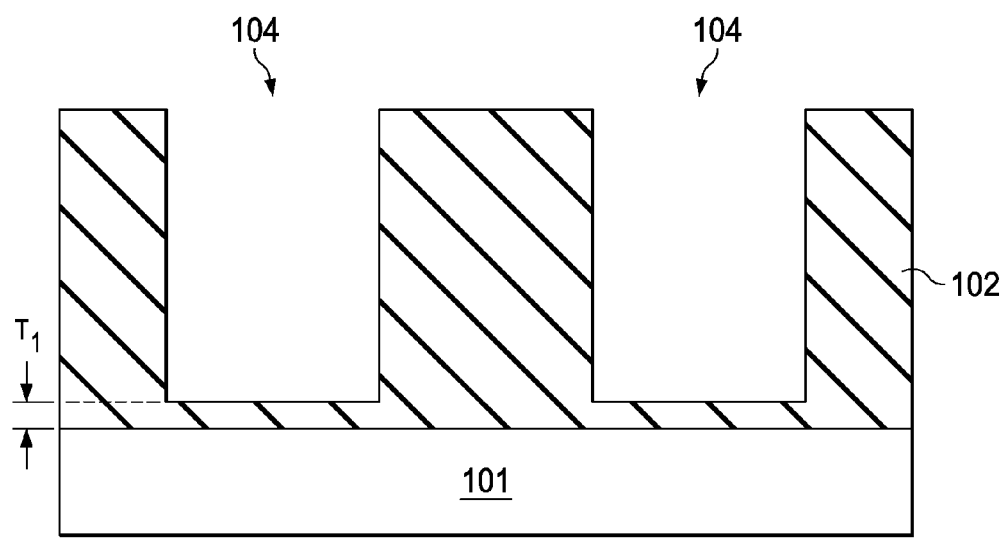

Referring first to FIGS. 1A and 1B, a portion of a substrate 101 is shown having a first insulating layer 102 formed thereon. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used.

The first insulating layer 102 is formed over the substrate 101. The first insulating layer 102 may comprise an oxide or other dielectric material, for example. The first insulating layer 102 may comprise, for example, $SiO_2$, $Al_2O_3$, or the like, and may be formed by, for example, plasma vapor deposition (PVD) or other suitable methods. The first insulating layer 102 may be formed to a thickness of about 0.5 μm to about 0.05 μm.

The first insulating layer 102 is patterned to form one or more trenches 104. As will be explained in greater detail below, vertical transistors will be formed along sidewalls (and/or the bottom) of the trenches. The trenches in the first insulating layer 102 may be formed by etching the first insulating layer 102 using photolithography techniques. Generally, photolithography involves depositing a photoresist material (not shown), which is then masked, exposed, and developed. After the photoresist mask is patterned, an etching process may be performed to remove unwanted portions of the first insulating layer 102 as illustrated in FIGS. 1A and 1B. In an embodiment in which the first insulating layer 102 comprises $SiO_2$, the etching process may be a wet dip in dilute hydrofluoric acid. The excess photoresist material may be removed. Additional masks (not shown), e.g., hard masks, may be utilized in the etching process.

As another example, some embodiments form the first insulating layer 102 of $Al_2O_3$ using a PVD process. In these embodiments, the first insulating layer 102 may be etched using, for example, a reactive ion etch (RIE) process using a gas $CF_4/O_2$, $BCl_3$, $BCl_3/HBr$, $Cl_2$, $Cl_2/Ar$, or the like.

As illustrated in FIGS. 1A and 1B, a portion of the first insulating layer 102 remains over the substrate 101 along a bottom of the trenches 104. This remaining portion of the first insulating layer 102 along the bottom of the trench will allow a selective growth of an overlying 2D material layer. In some embodiments, a first thickness $T_1$ of about 100 nm to about 10 nm of the first insulating layer 102 remains along a bottom of the trenches 104.

Figure 2A:
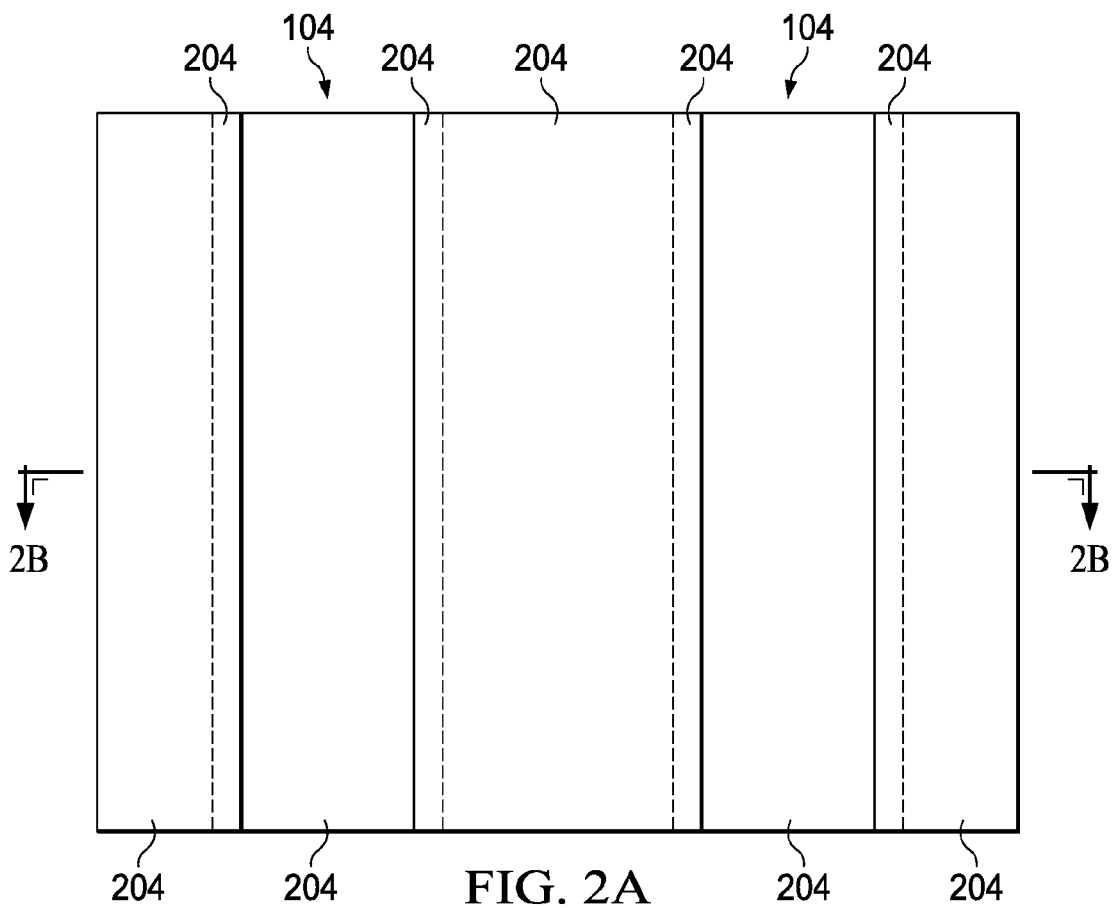
Figure 2B:
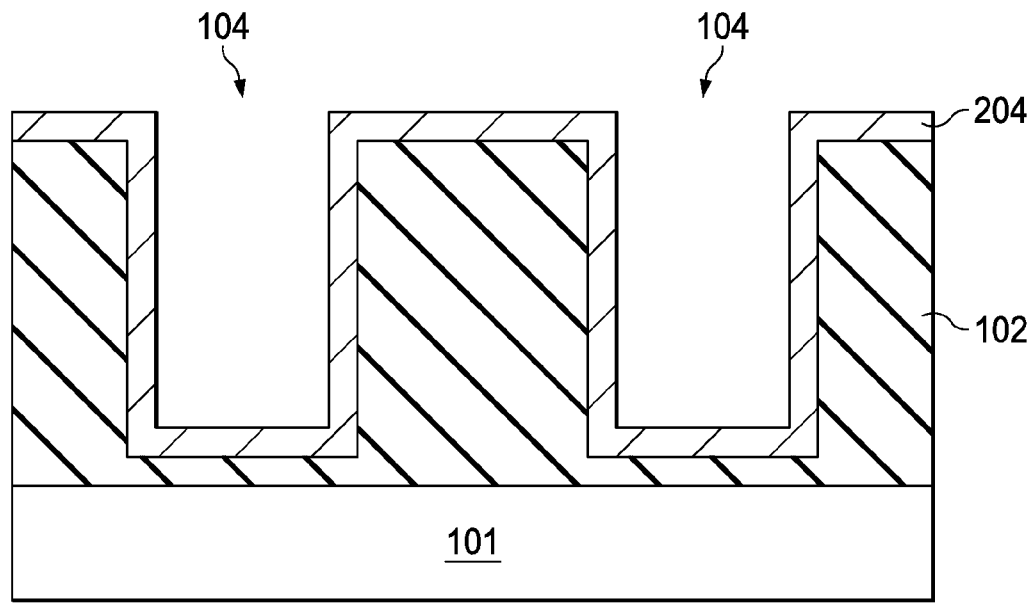

FIGS. 2A and 2B illustrate a thin 2D material layer 204 formed over the first insulating layer 102 in accordance with some embodiments. As described in greater detail below, the thin layer of 2D material layer 204 will act as a layer in which the source/drain regions and channel region are formed, thereby forming an UTB device. Suitable materials include, for example, graphene, TMDs, BN, or the like. Generally, a thin layer such as one or a few monolayers of a 2D material is deposited to act as the source/drain regions and/or the channel region. Examples of suitable TMDs include $MoO_3$ $MoS_2$, $WS_2$, $WSe_2$, $MoSe_2$, $MoTe_2$, and the like.

In some embodiments a one or a few monolayers of graphene, a TMD, BN or the like is formed using, for example, chemical vapor deposition (CVD), atmospheric pressure CVD (APCVD), low-pressure CVD (LPCVD) at a sub-atmospheric pressure, plasma enhanced CVD (PECVD), atomic layer CVD (ALCVD), or combinations thereof. For example, a graphene layer may be formed using $CH_4+H_2+Ar$. As another example, monolayers of graphene may be formed by dissociation of carbon atoms on a Cu surface. Generally, a CVD process is used to deposit a carbon species, such as $CH_4$, on a Cu surface. This process results in a graphene layer that diffuses through the Cu grain boundaries to the interface between the first insulating layer 102 and the Cu layer. The Cu layer may be subsequently removed, leaving the graphene monolayer on the first dielectric layer.

The graphene layer may exhibit a zero band gap. In these instances, it may be desirable to degeneratively dope the graphene layer. The doping may be performed in channel region and/or the source/drain regions. For example, in some embodiments, the graphene layer is doped with nitrogen in the channel region. The nitrogen doping may be performed using a CVD process by mixing ammonia with methane as a precursor gas and a copper thin film. As another example, in some embodiments, inducing charge carriers to the graphene layer is performed by the adsorption of various gases including $NH_3$, $H_2O$, $NO_2$, and the like. The doping of the channel region may be performed using a mask to protect the source/drain regions or incorporated into a gate-last approach when forming the gate electrode as discussed in greater detail below.

As another example, a monolayer of TMD $MoS_2$ may be formed using, for example, APCVD using $2MoO_3+7/8S_8$ at a temperature of about 650° C. Other materials and processes may be used. In some embodiments, a thickness of the thin 2D material layer 204 has a thickness of about 0.6 nm to about 3 nm, such as about 0.6 nm.

The 2D material layer 204 may also be doped in some embodiments. For example, in embodiments in which the thin 2D material layer 204 comprises a TMD such as $WeS_2$, a p-type device may be formed by, for example, doping the 2D material layer 204 with $NO_2$ molecules, which are expected to be absorbed both physically and chemically on top of the $WSe_2$ surface. The doping may be performed by exposing the 2D material layer 204 to 0.05% $NO_2$ in $N_2$ gas for 10 min. N-type devices may be formed by doping with, for example, potassium.

As illustrated in FIGS. 2A and 2B, the 3D structures of the trenches 104 increases the effective area of the 2D material layer. As explained in greater detail below, a gate electrode and will be formed over the 2D layer such that the gate width is increased by the use of the trenches 104, thereby increasing the effective gate width for a given footprint.

Figure 3A:
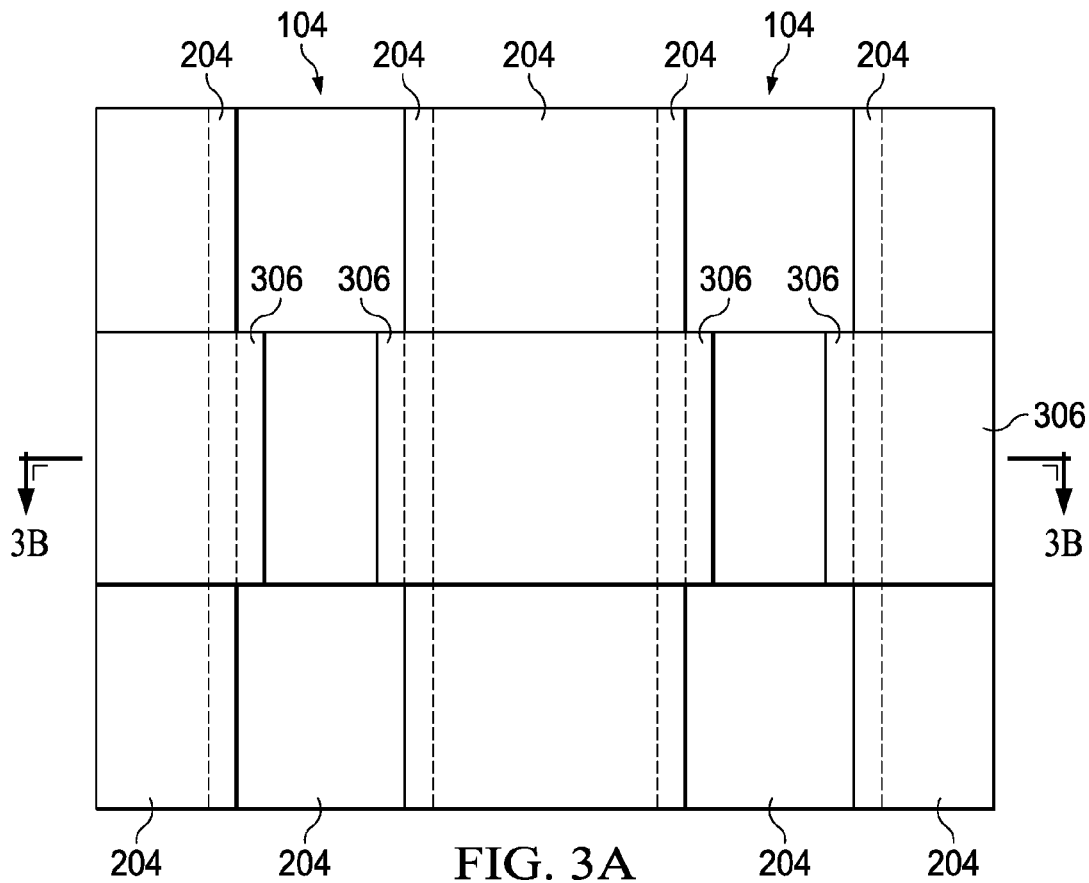
Figure 3B:
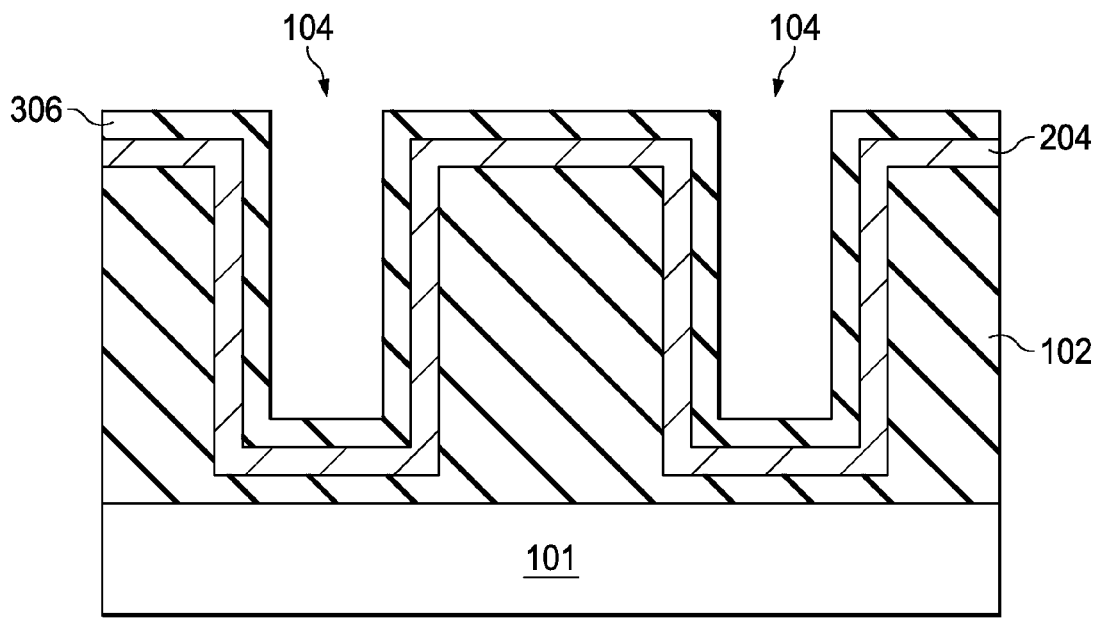

Referring now to FIGS. 3A and 3B, there is formed over the 2D material layer 204 a second dielectric layer 306 in accordance with some embodiments. As will be explained in greater detail below, a gate electrode will be formed over the second dielectric layer 306, such that the second dielectric layer 306 acts as a gate dielectric layer. In some embodiments, the second dielectric layer 306 includes one or more high-k dielectric layers (e.g., having a dielectric constant greater than 3.9). For example, the second dielectric layer 306 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, and the like. The formation methods of second dielectric layer 306 include molecular-beam deposition (MBD), atomic layer deposition (ALD), PVD, and the like. The gate dielectric may be patterned using photolithography techniques to expose portions of the 2D material layer 204 for forming source/drain contacts as illustrated in FIGS. 3A and 3B. In an embodiment, the second dielectric layer 306 may have a thickness of about 1 nm to about 5 nm.

In some embodiments, the first dielectric layer 102 and/or the second dielectric layer 306 are formed of high-k dielectric materials. The use of the high-k dielectric materials strongly dampen scattering from Coulombic impurities.

Figure 4A:
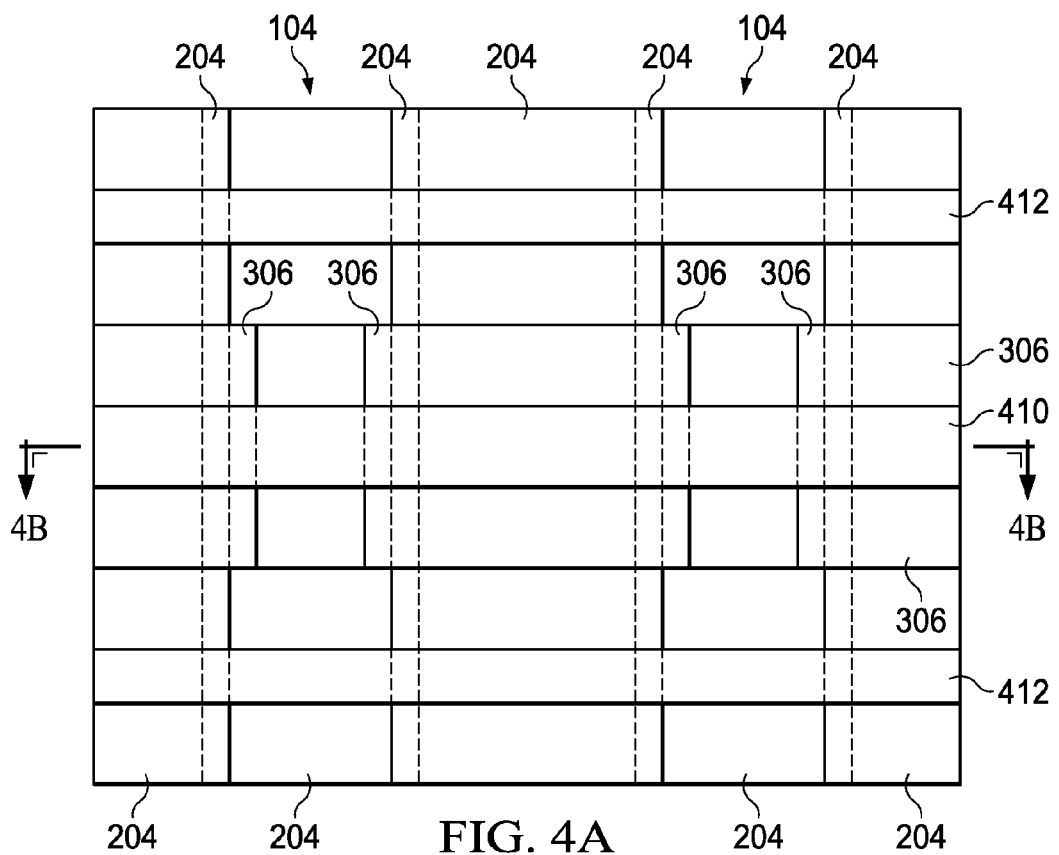
Figure 4B:
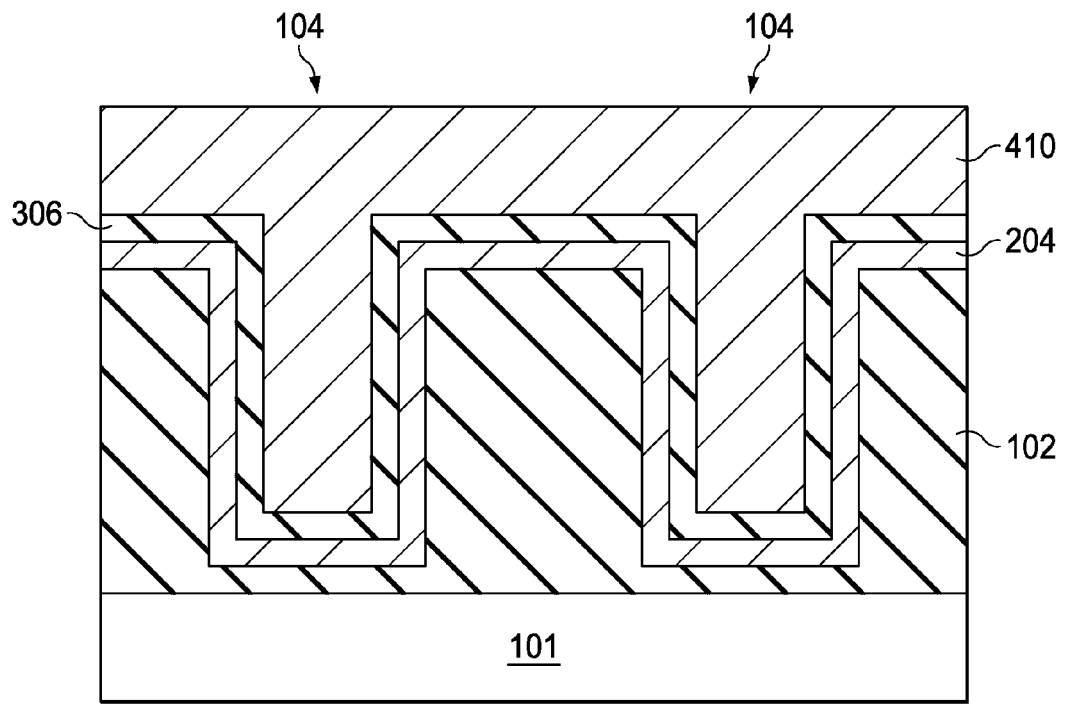

FIGS. 4A and 4B illustrate a gate electrode 410 formed over the second dielectric layer 306 and source/drain contacts 412 formed over the thin 2D material layer 204 in accordance with some embodiments. The gate electrode 410 and the source/drain contacts 412 may be formed of any suitable conductive material. For example, in some embodiments, the gate electrode 410 and the source/drain contacts 412 may be formed of a doped polysilicon, a metal (such as titanium, palladium, tungsten, aluminum, copper, nickel, gold, alloys thereof, combinations thereof, and the like), or the like.

The gate electrode 410 and the source/drain contacts 412 may be formed using any suitable process. For example, in some embodiments the gate electrode 410 and the source/drain contacts 412 may be formed using a gate first process, in which a layer of conductive material is formed over the substrate and patterned to form the gate electrode 410 and the source/drain contacts 412.

As another example, in some embodiments the gate electrode 410 and the source/drain contacts 412 may be formed using a gate last process. Generally, a gate last process forms a sacrificial gate stack. Source/drain regions may be doped, if necessary, using the sacrificial gate stack as a mask for the channel region. A first interlayer dielectric (ILD) layer is formed such that an upper surface of the sacrificial gate stack is exposed. The sacrificial gate stack is then removed, thereby forming an opening in the ILD layer. A gate, such as a metal gate stack, is formed in the opening. In a gate last process, an interfacial layer and the gate dielectric may be formed upon removing the sacrificial gate stack.

The gate electrode 410 and the source/drain contacts 412 are shown for illustrative purposes only and may include multiple other features. For example, work metal function layers may be formed and a composite gate stack may be utilized. As another example, various spacers and liners may be utilized to adjust the source/drain regions for a particular design. The process used to form the gate electrode 410 and the source/drain contacts 412, such as a gate first approach or a gate last approach, may also utilize different structures.

Figure 5A:
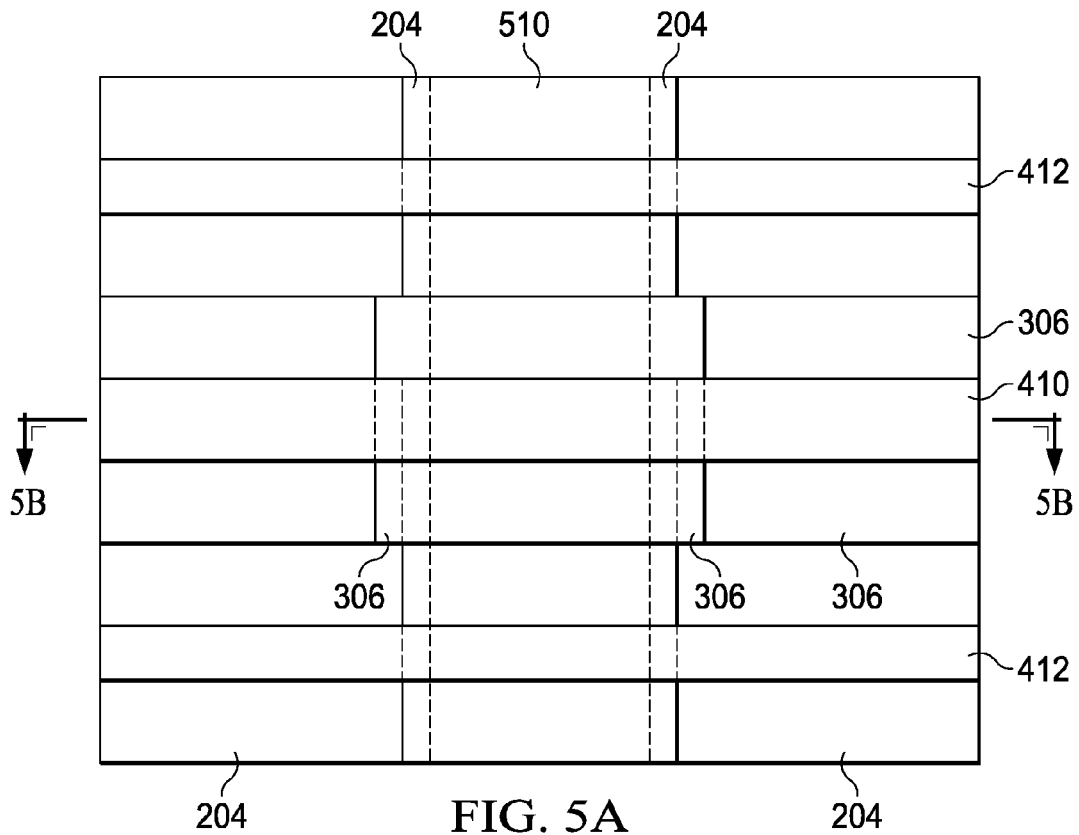
FIGS. 5A-5B illustrate a plan view and a cross-sectional view of a device in accordance with some embodiments.
Figure 5B:
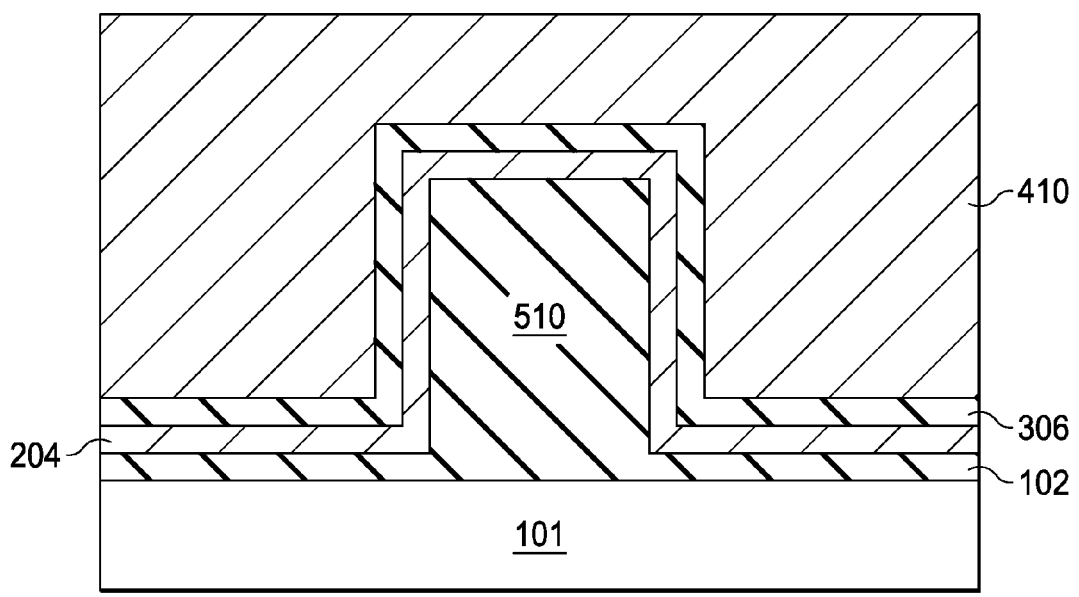

FIGS. 5A and 5B illustrate an embodiment in which a transistor having vertical channel structures formed along surfaces of a dielectric fin in accordance with some embodiments. FIGS. 1A-4B and the relevant discussion above disclose a transistor formed in a trench of a dielectric layer. Other embodiments may utilize similar processes and materials to form a transistor having the thin 2D layer along surfaces of a fin, such as a fin formed between adjacent trenches.

For example, FIG. 5B illustrates a fin 510 formed from the first insulating layer 102. In comparison with FIG. 1B, the first insulating layer 102 is patterned to form the fin 510 from the insulating layer 102. Generally, similar processes as those discussed above to form the trench may be used to form the fin 510, wherein the fin 510 may be a region between adjacent trenches.

Thereafter, similar processes and materials as discussed above may be used to complete the fabrication, wherein like reference numerals refer to like elements.

Figure 5C:
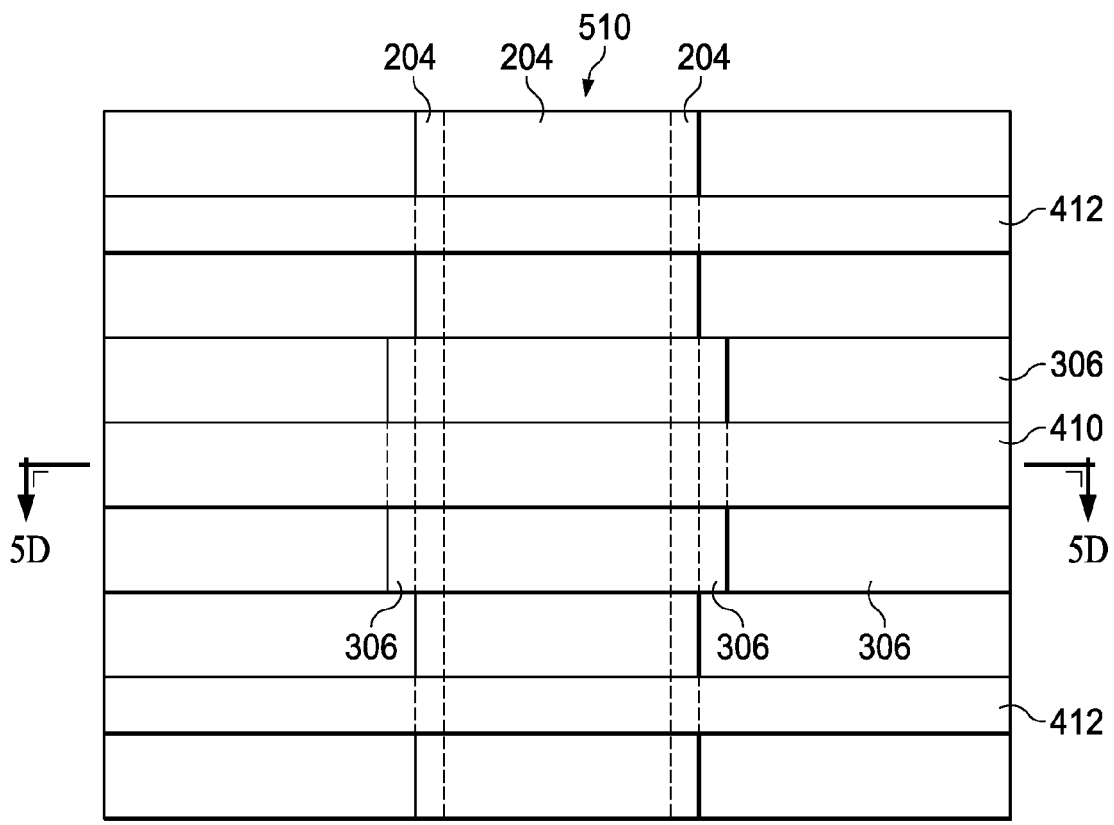
FIGS. 5C-5D illustrate a plan view and a cross-sectional view of a device in accordance with some embodiments.
Figure 5D:
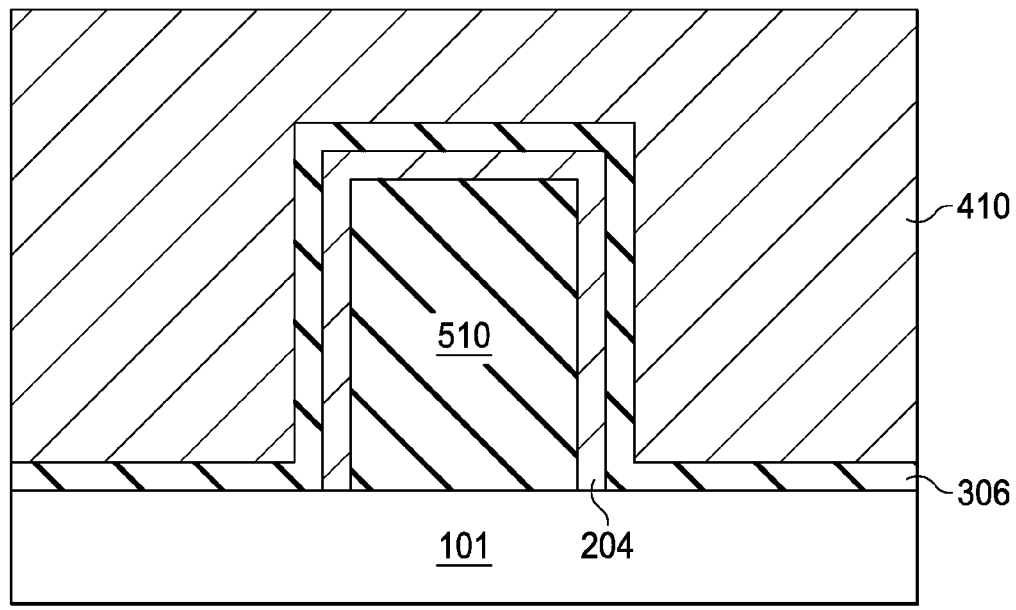

FIGS. 5C and 5D illustrates an embodiment in which a transistor having vertical channel structures is formed along surfaces of a dielectric fin in accordance with some embodiments. FIGS. 1A-4B and the relevant discussion above disclose a transistor formed in a trench of a dielectric layer. Other embodiments may utilize similar processes and materials to form a transistor having the thin 2D layer along surfaces of a fin.

For example, FIG. 5D illustrates a fin 510 formed from the first insulating layer 102. In comparison with FIG. 1B, the first insulating layer 102 is patterned to form the fin 510. Generally, similar processes as those discussed above to form the trench may be used to form the fin 510 by continuing the etch process to the substrate 101.

In comparison with the embodiment illustrated in FIGS. 5A and 5B, the first insulating layer 102 and the thin 2D material layer 204 do not extend along the surface of the substrate 101 away from the fin 510.

Thereafter, similar processes and materials as discussed above may be used to complete the fabrication, wherein like reference numerals refer to like elements.

FIGS. 6A-11B illustrate various intermediate stages of fabrication of a semiconductor device having vertical channel structures in accordance with some embodiments. FIGS. 6A-11B illustrate the cross-sectional views and plan views, wherein the "A" figures represent the plan view and the "B" figures represent the cross-sectional view along the B-B line of the respective "A" figure. It is noted that like reference numerals refer to like elements as those discussed above with reference to FIGS. 1A-5B.

As explained in greater detail below, embodiments such as those described with reference to FIGS. 6A-11B, a 2D material layer is formed along sidewalls of one or more trenches 104. In comparison to embodiments such as those discussed above with reference to FIGS. 1A-4B, wherein the 2D material layer, which serves as a source/drain region and a channel region, extends along a bottom of the trenches and along an upper surface of the dielectric layer between adjacent trenches, embodiments such as those discussed below with reference to FIGS. 6A-11B omit the 2D material layer from the horizontal surfaces of the bottoms of the trenches and along upper surfaces of the first dielectric layer 102. In this manner, separate source/drain and channel regions may be formed along opposing sidewalls of the trenches, which may be tied together with a common gate electrode or may be controlled by separate gate electrodes.

Figure 6A:
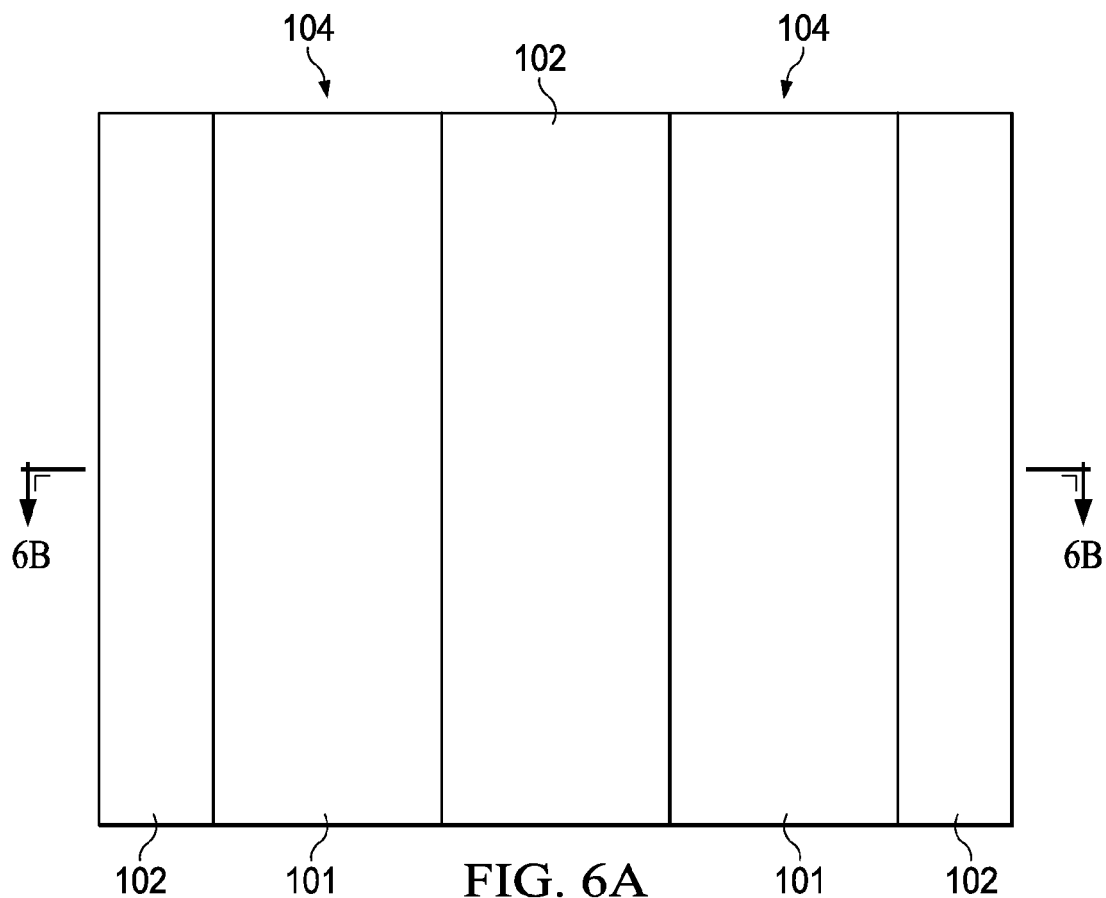
FIGS. 6A-10B illustrate various plan views and cross-sectional views of a fabrication process of a device in accordance with some embodiments.
Figure 6B:
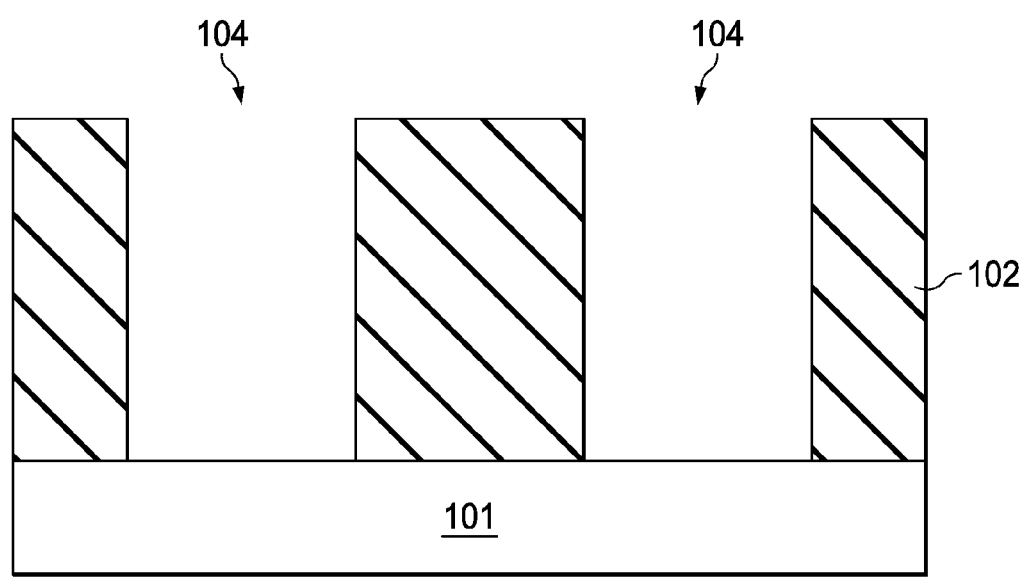

Referring first to FIGS. 6A and 6B, a portion of a substrate 101 is shown having a first insulating layer 102 formed thereon. The substrate 101 and the first insulating layer 102 may be formed of similar materials and processes as those discussed above with reference to FIGS. 1A and 1B, wherein the like reference numerals refer to like elements.

As shown in FIGS. 6A and 6B, the trenches 104 in the first insulating layer 102 extend to the underlying substrate 101, whereas FIGS. 1A-4B illustrate embodiments in which a portion of the first insulating layer 102 remains along a bottom of the trenches 104. As explained below, the 2D material layer is formed using a selective growth process, and by extending the trench 104 to the substrate 101, the subsequently formed 2D material layer will not form along the bottom of the trench.

Figure 7A:
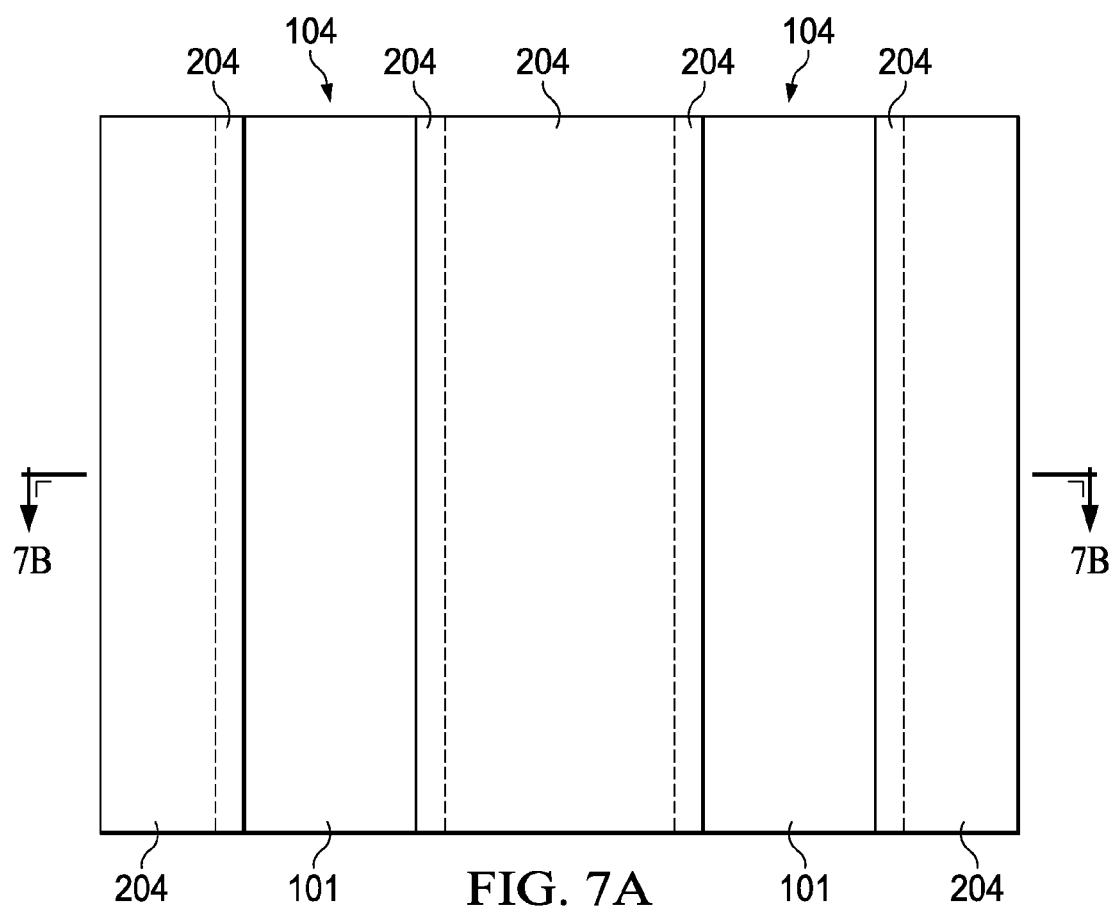
Figure 7B:
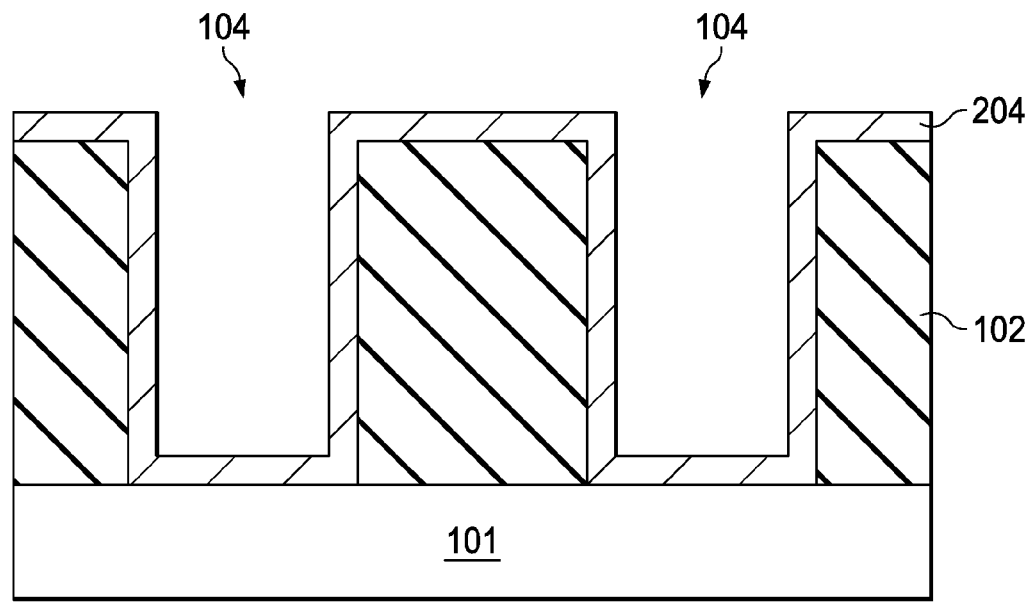

FIGS. 7A and 7B illustrate a thin 2D material layer 204 formed over the first insulating layer 102 in accordance with some embodiments. As described in greater detail below, the thin layer of semiconductor material 204 will act as a 2D material layer in which the source/drain regions and channel region are formed, thereby forming an UTB device.

The thin 2D material layer 204 may be formed of similar materials and processes as those discussed above. In some embodiments, the formation of the thin 2D material layer 204 is a selective growth process. For example, in some embodiments, the first insulating layer 102 comprises a $SiO_2$ formed by PECVD and the thin 2D material layer 204 is formed of a TMD using CVD techniques. In this manner, the TMD layer will be formed over the first insulating layer and will not be formed over the substrate 101 along the bottom of the trenches.

Suitable materials include, for example, graphene, TMDs, BN, or the like. Generally, a thin layer such as a monolayer of a 2D material layer is deposited to act as the source/drain regions and/or the channel region. Examples of suitable TMDs include $MoO_3$ $MoS_2$, $WS_2$, $WSe_2$, $MoSe_2$, $MoTe_2$, and the like. Other materials and processes may be used. In some embodiments, a thickness of the 2D material layer 204 has a thickness of about 0.6 nm to about 3 nm, such as about 0.6 nm.

Figure 8A:
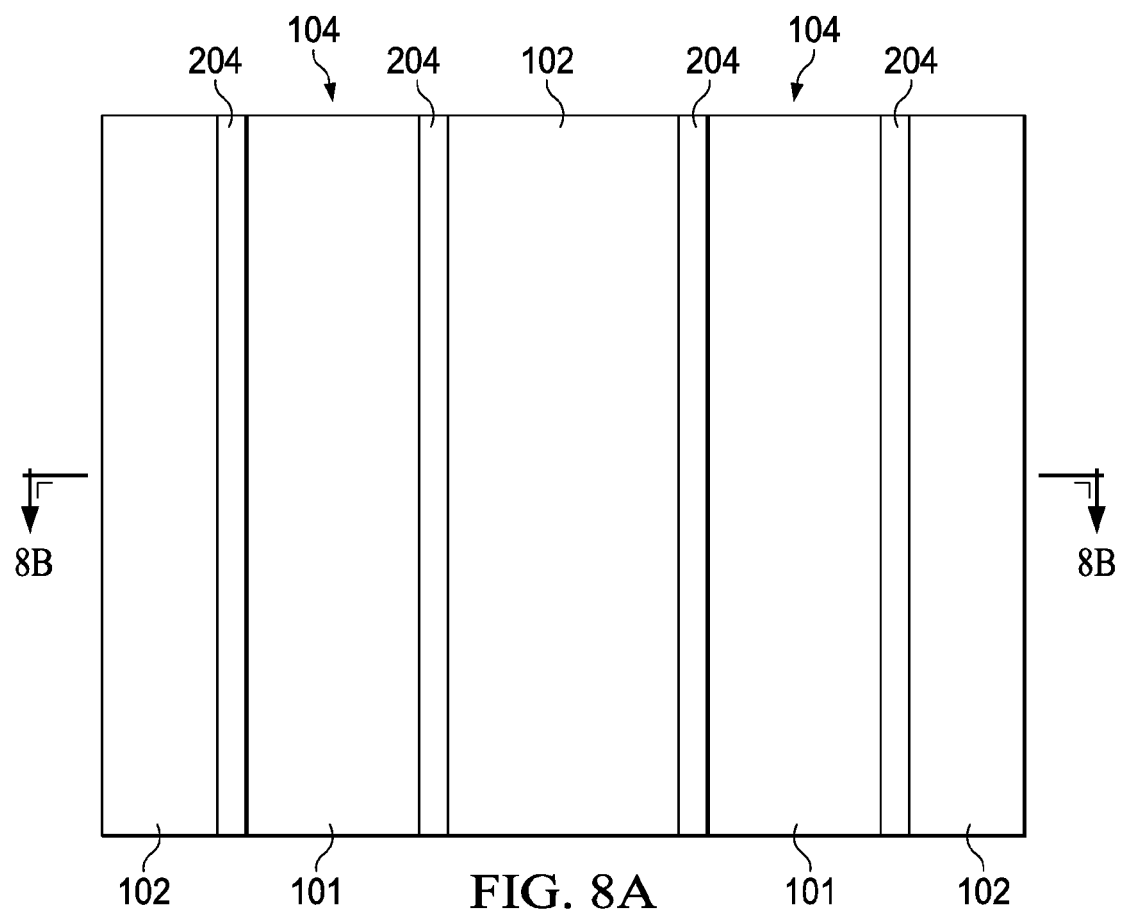
Figure 8B:
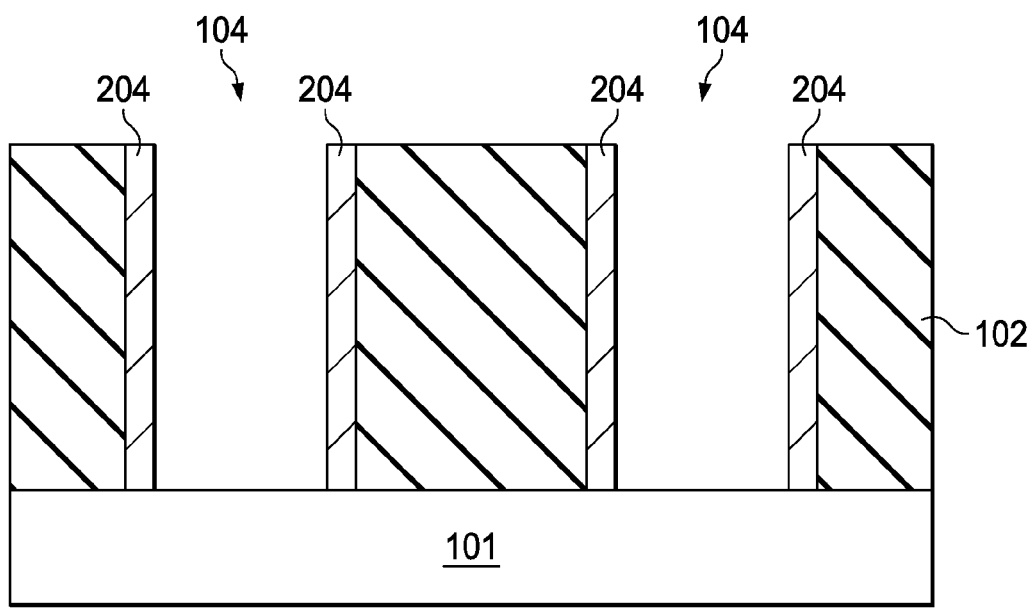

Referring now to FIGS. 8A and 8B, portions of the 2D material layer 204 extending over an upper surface of the first insulating layer 102 is removed in accordance with some embodiments. In some embodiments, a CMP process is performed to remove the 2D material layer 204 from an upper surface of the first insulating layer 102. As a result of this process, the 2D material layer 204 remains along sidewalls of the trenches and is removed from the horizontal surfaces, thereby forming separated vertical strips of the 2D material layer 204.

In an alternative embodiment, an anisotropic etch process may be performed. For example, in some embodiments in which a MoS$_2$ TMD material is used for the 2D material layer 204, an anisotropic etch process using, for example, Reactive Ion Etching (RIE) may be used.

In yet another alternative embodiment, a portion of the first insulating layer 102 may remain along a bottom of the trenches 102. In this embodiment, the 2D material layer 204 may extend along a bottom of the trenches 102 over the first insulating layer 102. An anisotropic etch process removes the 2D material layer 204 along the horizontal surfaces, such that the 2D material layer 204 remains along the sidewalls of the trenches 102, similar to that illustrated in FIGS. 8A and 8B.

Figure 9A:
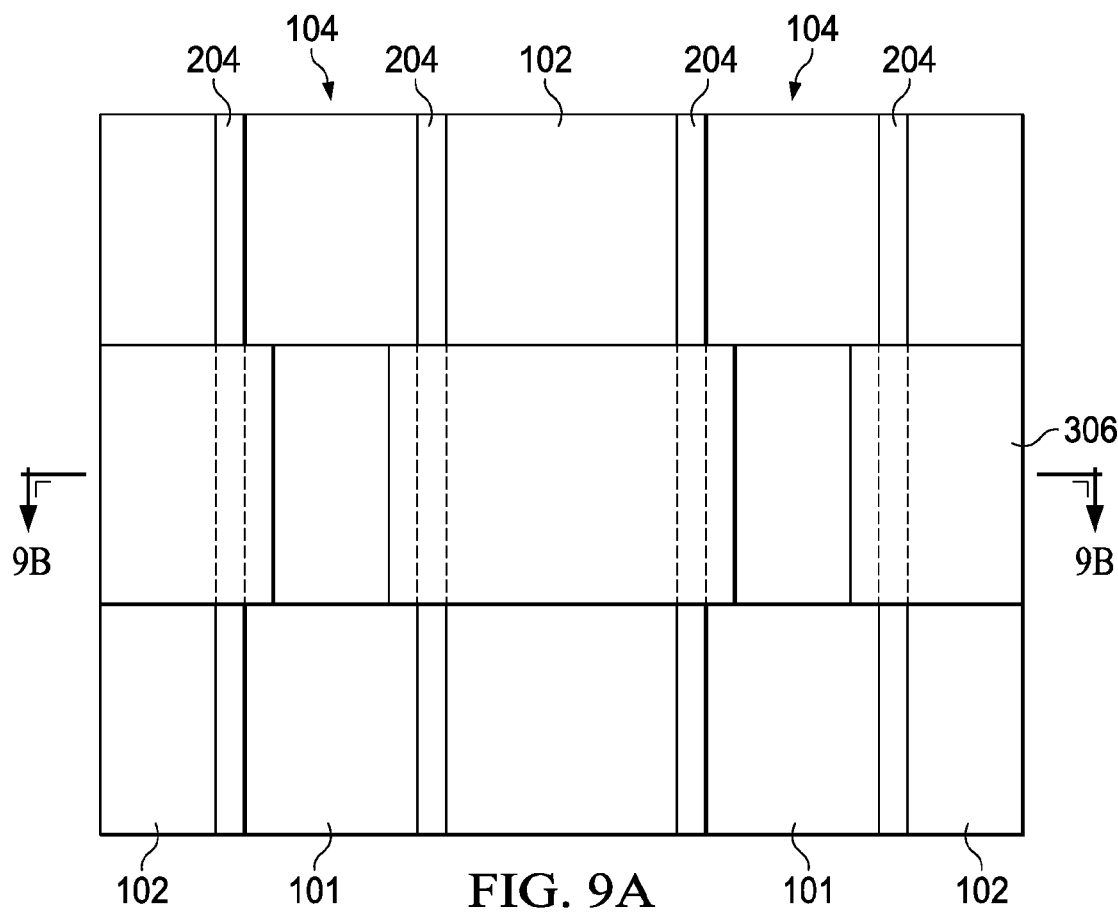
Figure 9B:
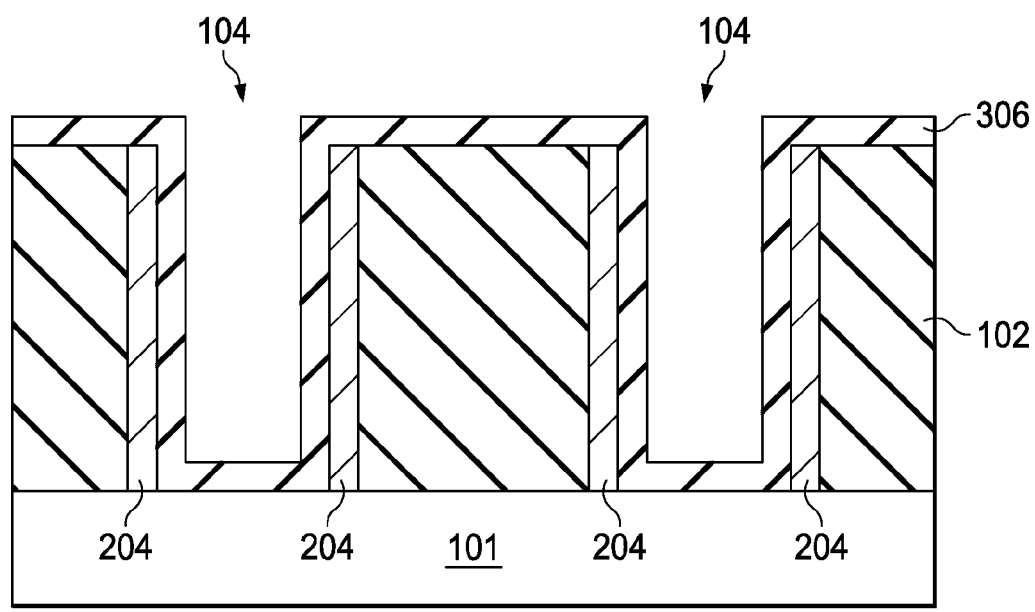

Referring now to FIGS. 9A and 9B, there is formed over the 2D material layer 204 a second dielectric layer 306 in accordance with some embodiments. As will be explained in greater detail below, a gate electrode will be formed over the second dielectric layer 306, such that the second dielectric layer 306 acts as a gate dielectric layer. In some embodiment, the second dielectric layer 306 includes one or more high-k dielectric layers (e.g., having a dielectric constant greater than 3.9). Similar processes and similar materials as those discussed above may be used to form and pattern, although different processes and/or materials may also be used. In an embodiment, the second dielectric layer 306 may have a thickness of about 1 nm to about 3 nm.

Figure 10A:
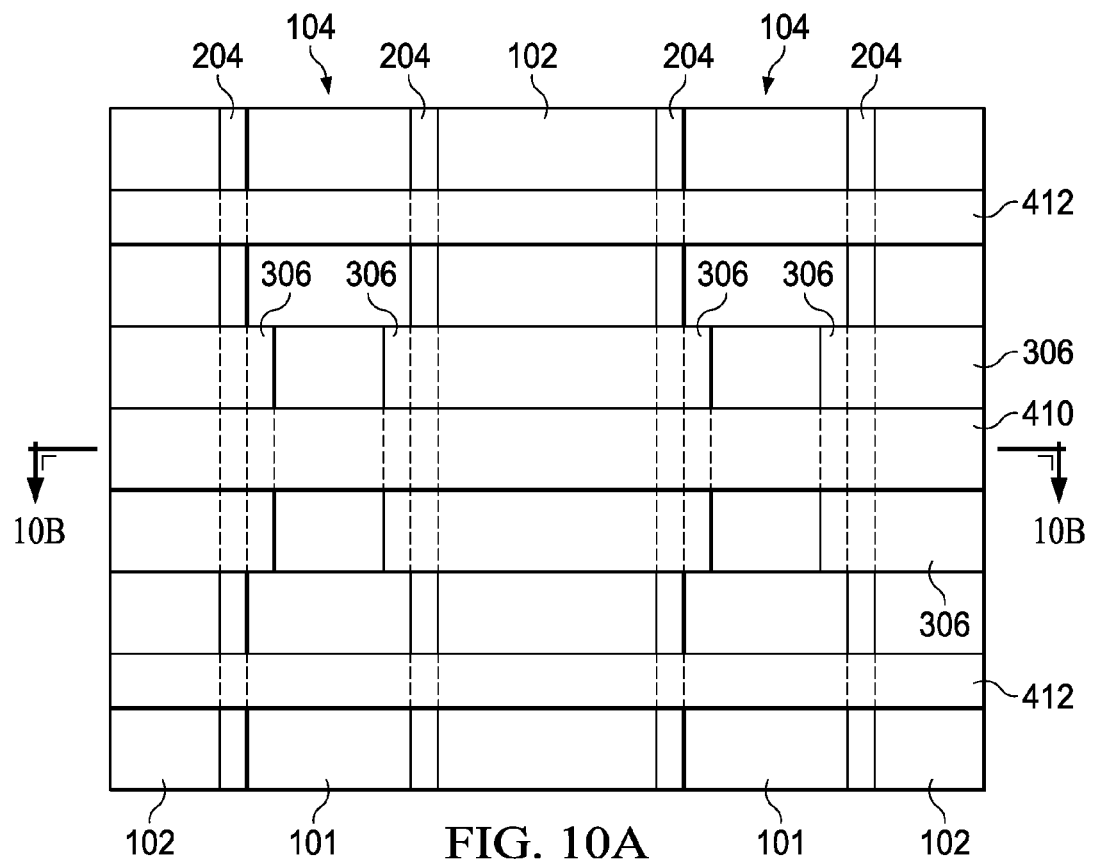
Figure 10B:
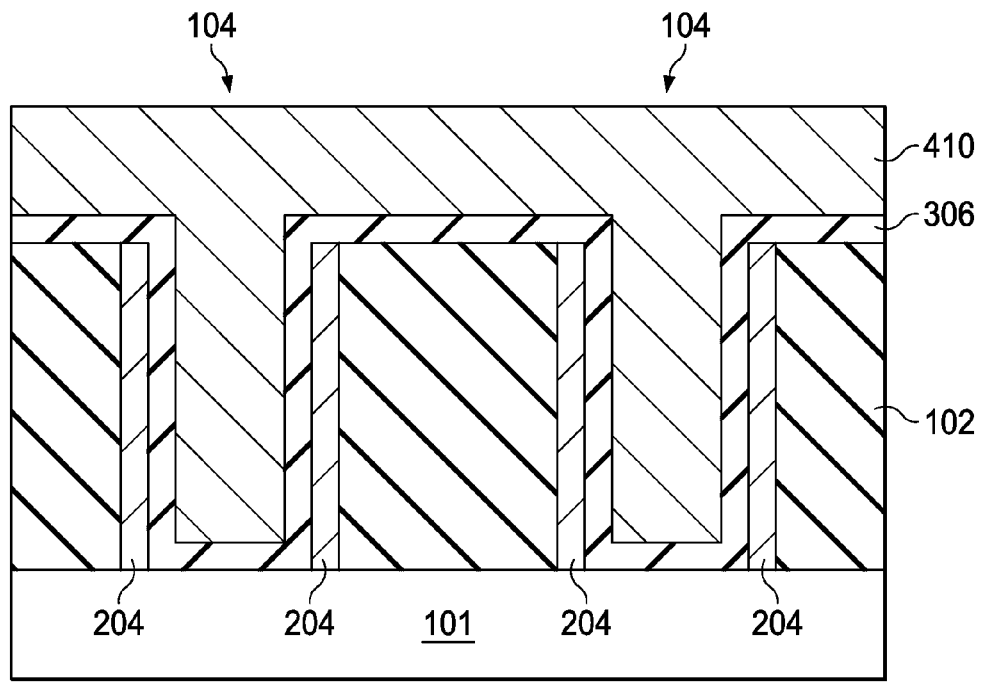

Referring to FIGS. 10A and 10B, a gate electrode 410 and source/drain contacts 412 over the second dielectric layer 306. The gate electrode 410 and the source/drain contacts 412 may be formed using similar processes and materials as those discussed above, although different processes and/or materials may also be used.

Figure 11A:
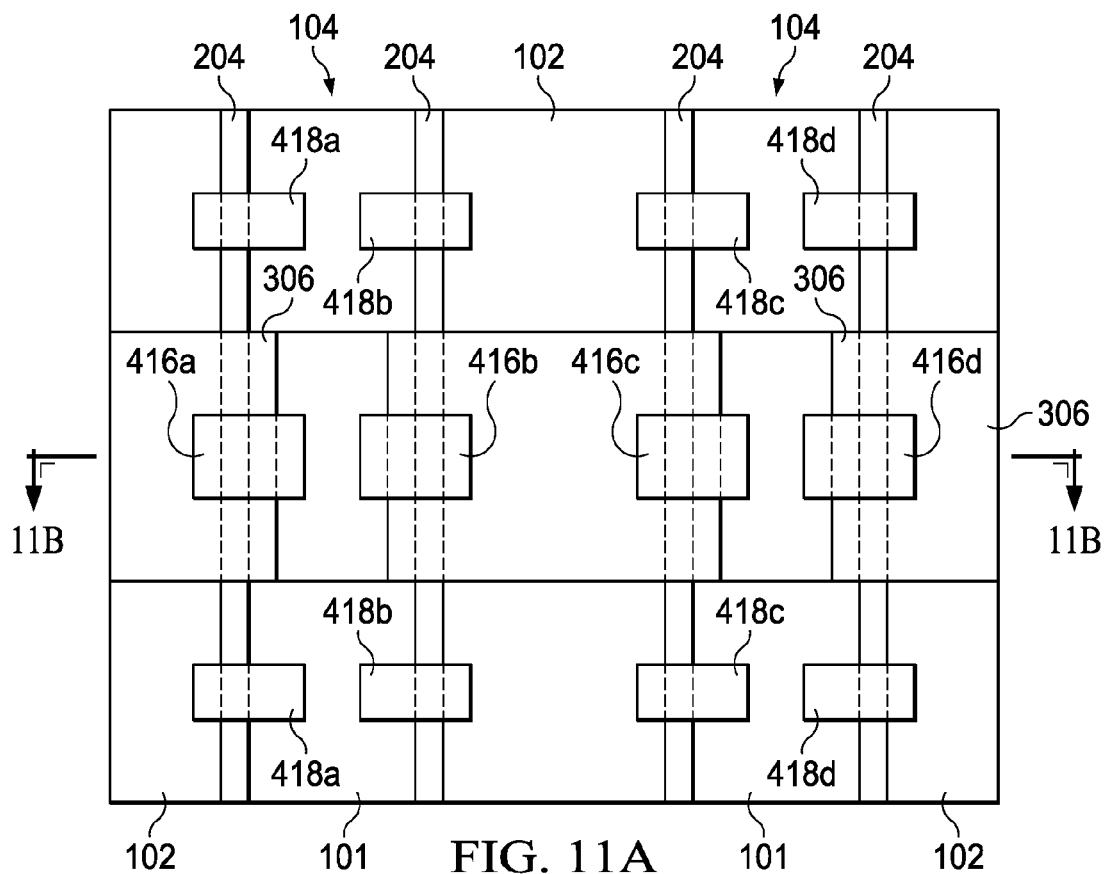
FIGS. 11A-11B illustrate a plan view and a cross-sectional view of a device in accordance with some embodiments.
Figure 11B:
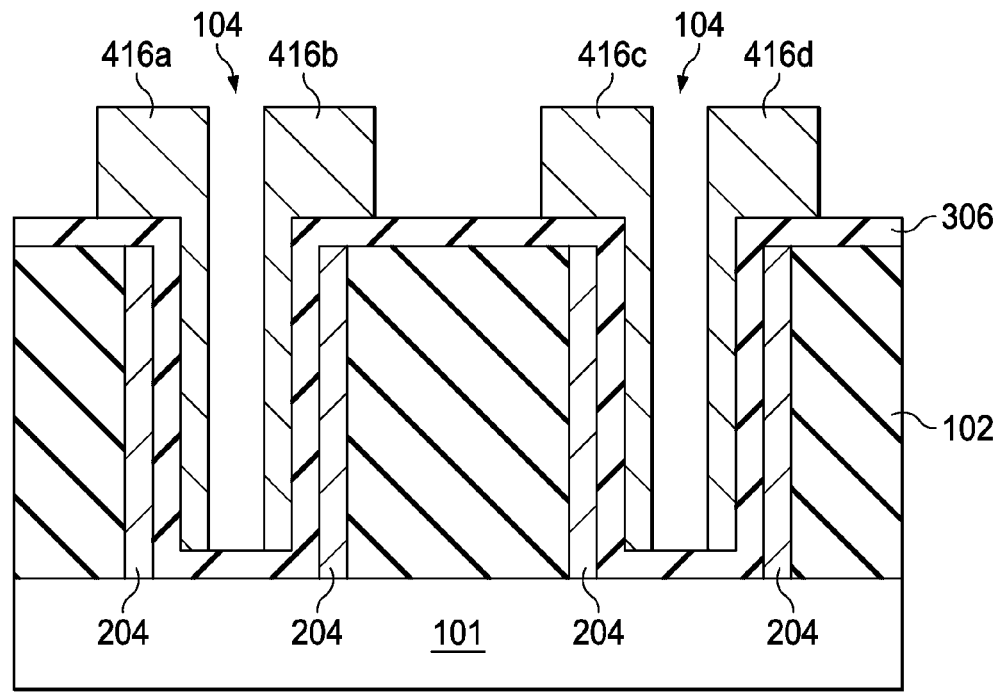

FIGS. 10A and 10B illustrate an embodiment in which a common gate electrode and common source/drain contacts are used. In some embodiments, such as that illustrated in FIGS. 11A and 11B, separate gate electrodes and separate source/drain contacts may be used. For example, FIGS. 11A and 11B illustrates gate electrodes 416a-416d and source/drain contacts 418a-418d. Embodiments such as these provide four separate transistors. Other embodiments may utilize a combination of common gate electrodes and/or common source/drain contacts between two of more of the separate transistors as part of forming a circuit for a particular application.

It should also be noted that additional layers, such as barrier layers, liners, adhesion layers and the like may also be included.

Figure 12A:
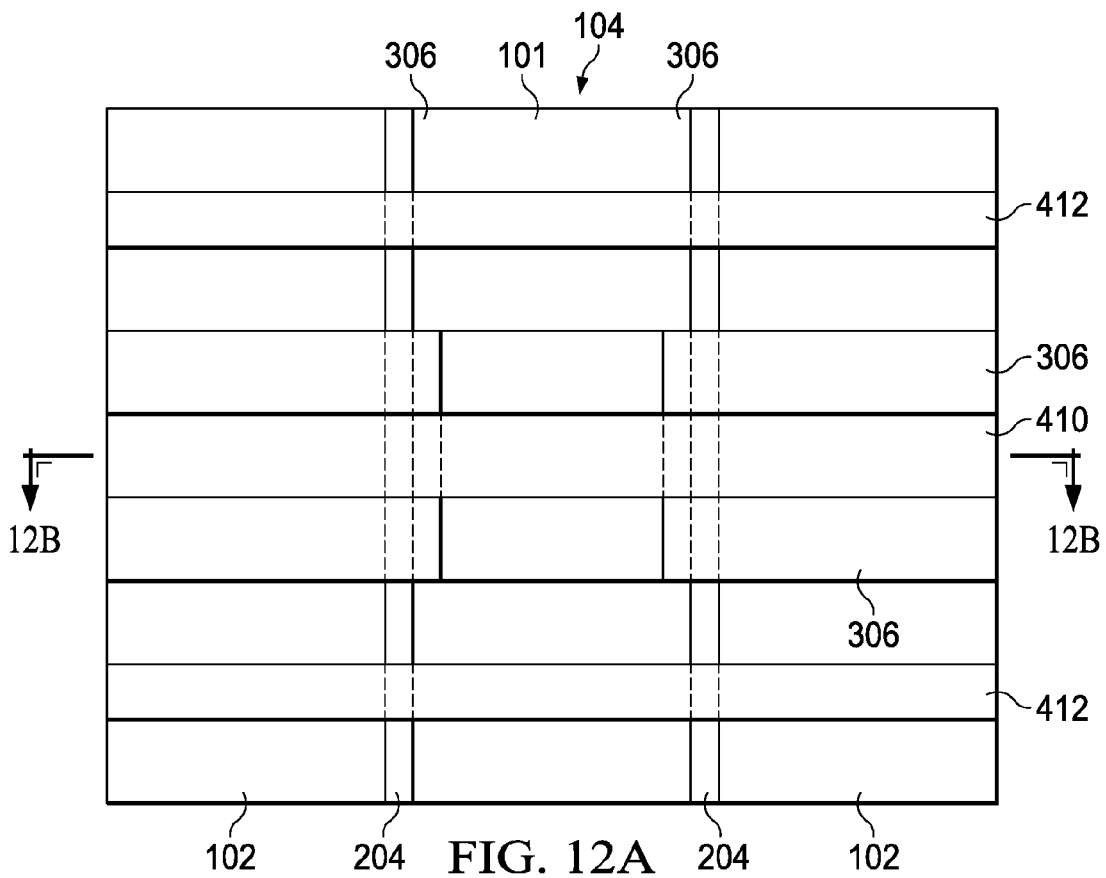
FIGS. 12A-12B illustrate a plan view and a cross-sectional view of a device in accordance with some embodiments.
Figure 12B:
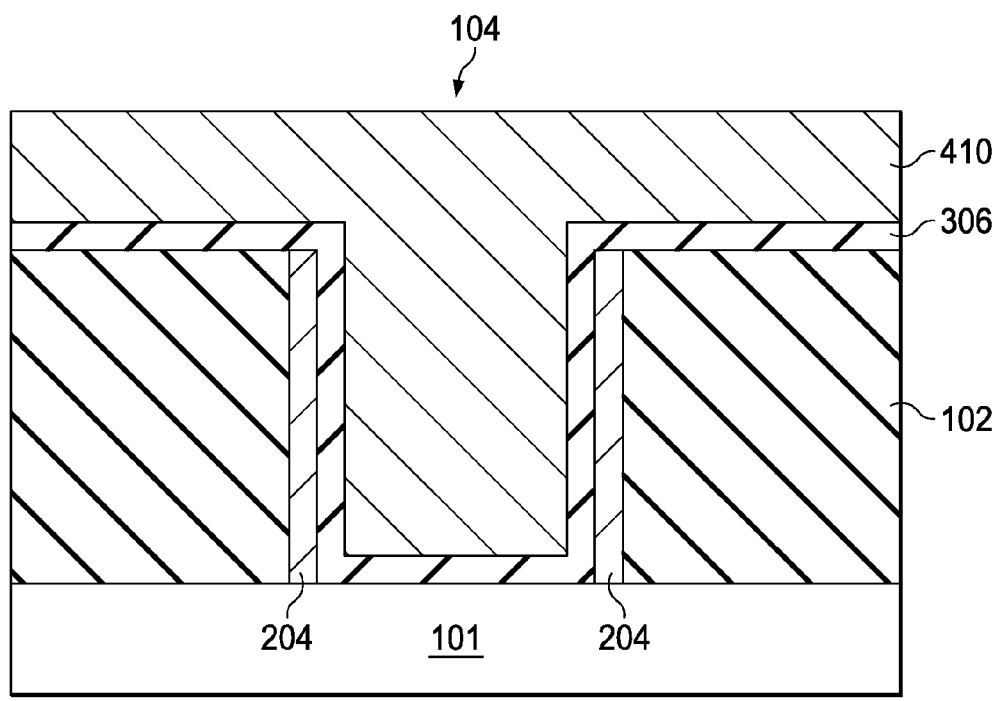

Embodiments such as that discussed above illustrate an embodiment in which two trenches are formed for illustrative purposes only. In other embodiments, more or fewer trenches, and hence more or fewer vertical transistor structures may be provided. For example, FIGS. 12A and 12B illustrate a plan view and a cross-sectional view, respectively, of an embodiment in which a single trench is formed.

FIGS. 13A-17B illustrate various intermediate stages of fabrication of a semiconductor device having vertical channel structures in accordance with some embodiments. FIGS. 13A-17B illustrate the cross-sectional views and plan views, wherein the "A" figures represent the plan view and the "B" figures represent the cross-sectional view along the B-B line of the respective "A" figure. It is noted that like reference numerals refer to like elements as those discussed above with reference to FIGS. 1A-5B.

As explained in greater detail below, embodiments such as those describe with reference to FIGS. 13A-17B, a 2D material layer is formed along sidewalls and bottoms of one or more trenches. In comparison to embodiments such as those discussed above with reference to FIGS. 1A-5B, wherein the 2D material layer that serves as a source/drain region and a channel region extends along a bottom of the trenches and along an upper surface of the second dielectric layer 204 between adjacent trenches 104, embodiments such as those discussed below with reference to FIGS. 13A-17B remove the 2D material layer from an uppermost surface of the dielectric layer such that the 2D material layer is formed along sidewalls and the bottom of the trenches. In comparison to embodiments such as those discussed above with reference to FIGS. 6A-12B, wherein the 2D material layer is omitted from the horizontal surfaces of the bottoms of the trenches and an uppermost surface of the dielectric layer, embodiments such as those discussed below with reference to FIGS. 13A-17B remove the 2D material layer from an uppermost surface of the dielectric layer, leaving the 2D material layer formed along sidewalls and the bottom of the trenches.

Figure 13A:
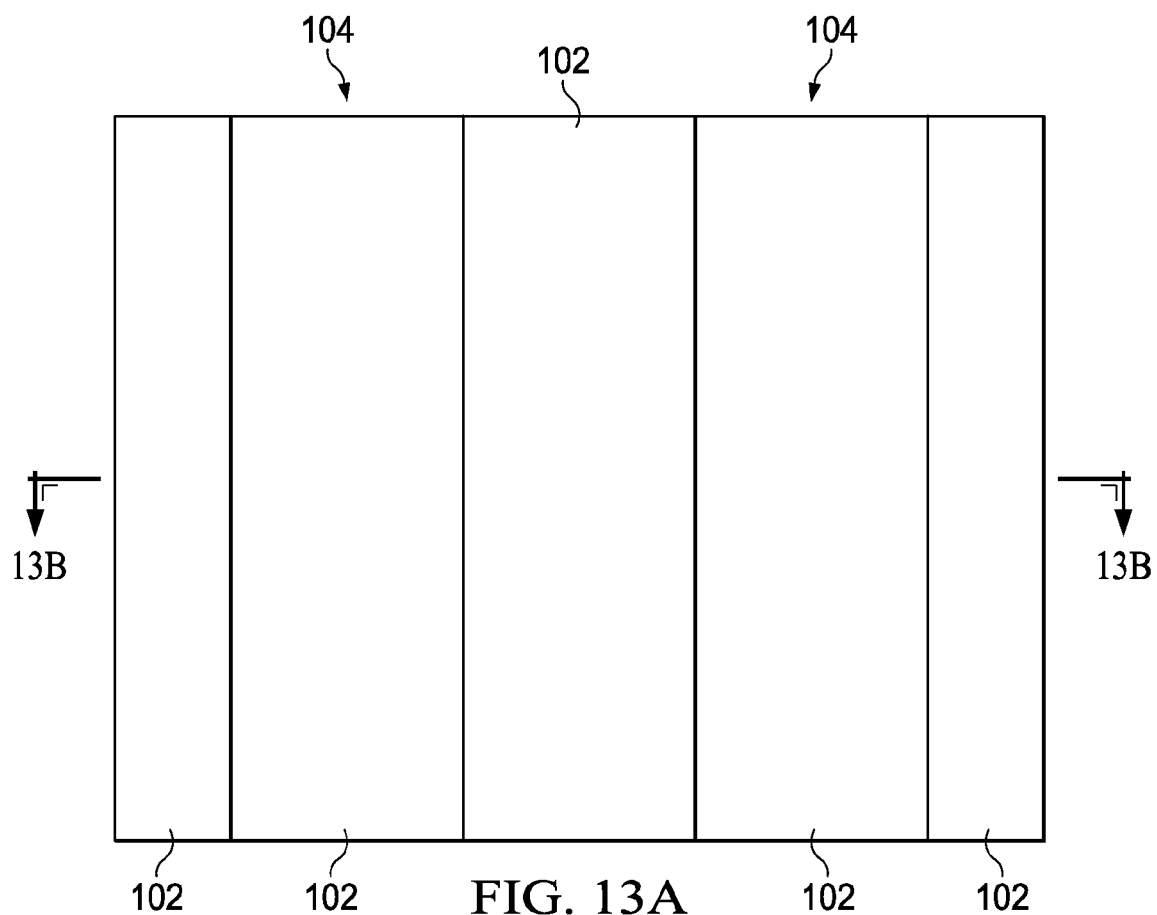
FIGS. 13A-17B illustrate various plan views and cross-sectional views of a fabrication process of a device in accordance with some embodiments.
Figure 13B:
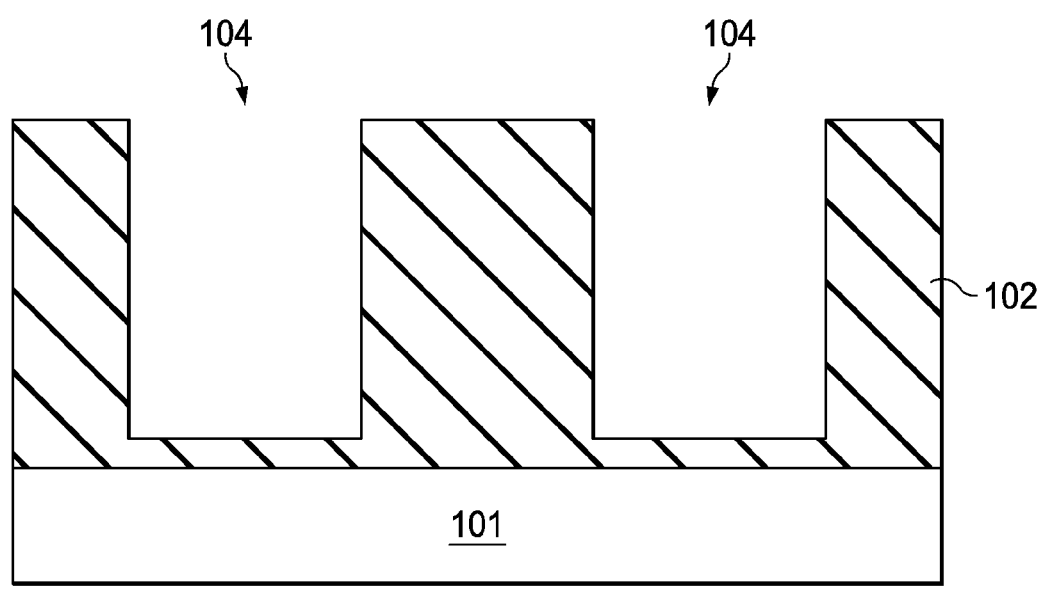

Referring first to FIGS. 13A and 13B, a portion of a substrate 101 is shown having a first insulating layer 102 formed thereon. The substrate 101 and the first insulating layer 102 may be formed of similar materials and processes as the like reference numerals discussed above with reference to FIGS. 1A and 1B.

As shown in FIGS. 13A and 13B, a portion of the first insulating layer 102 remains over the substrate 101 along a bottom of the trenches 104. This remaining portion of the first insulating layer 102 along the bottom of the trench will allow the selective growth of an overlying 2D material layer. In some embodiments, a first thickness T1 of about 10 nm to about 100 nm of the first insulating layer 102 remains along a bottom of the trenches 104.

Figure 14A:
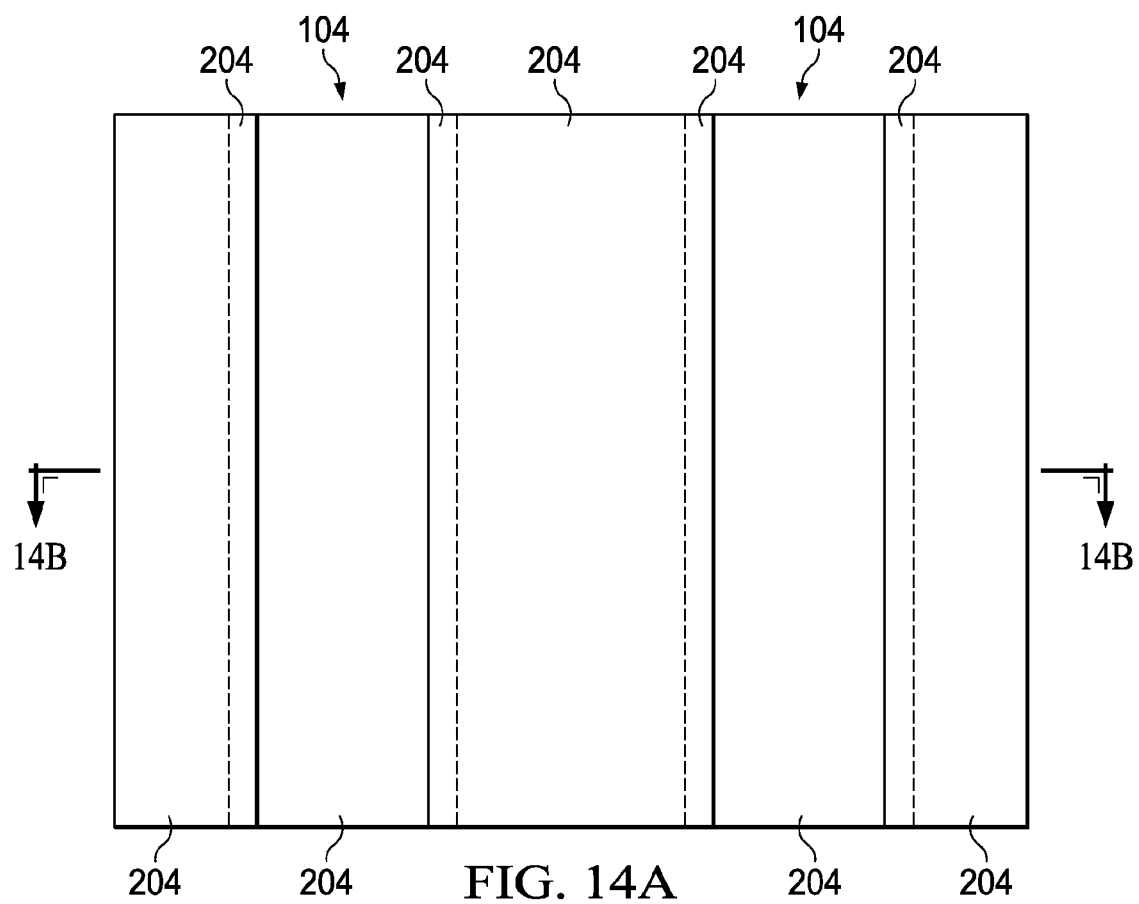
Figure 14B:
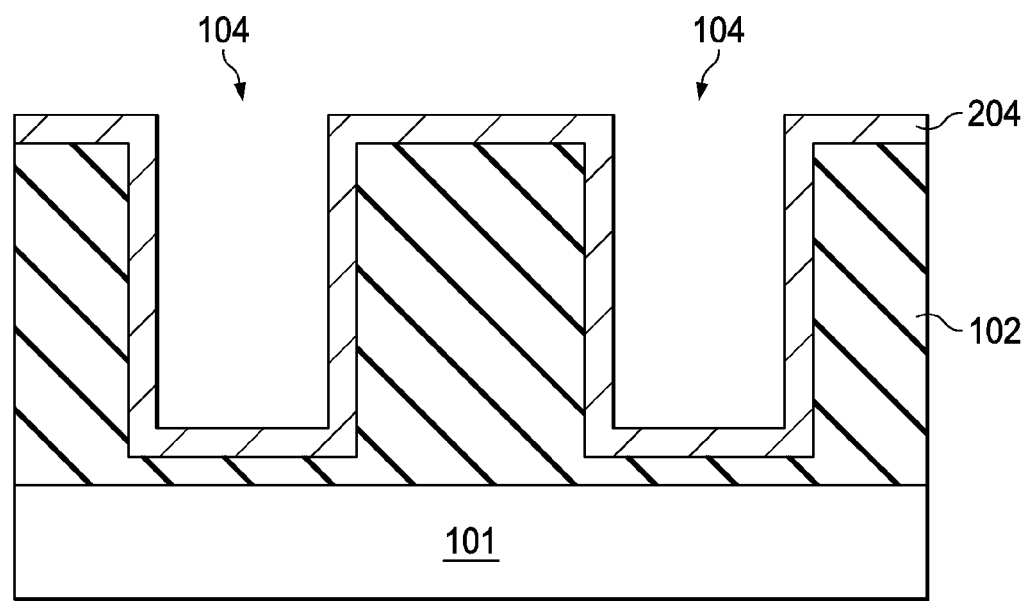

FIGS. 14A and 14B illustrate a thin 2D material layer 204 formed over the first insulating layer 102 in accordance with some embodiments. As described in greater detail below, the thin layer of semiconductor material 204 will as a 2D material layer in which the source/drain regions and channel region are formed, thereby forming an UTB device.

The thin 2D material layer 204 may be formed of similar materials and processes as those discussed above. In some embodiments, the thin 2D material layer 204 is formed along sidewalls and a bottom of the trenches 104, as well as along an uppermost surface of the first insulating layer 102. In some embodiments, a thickness of the 2D material layer 204 has a thickness of about 0.6 nm to about 3 nm, such as about 0.6 nm.

Figure 15A:
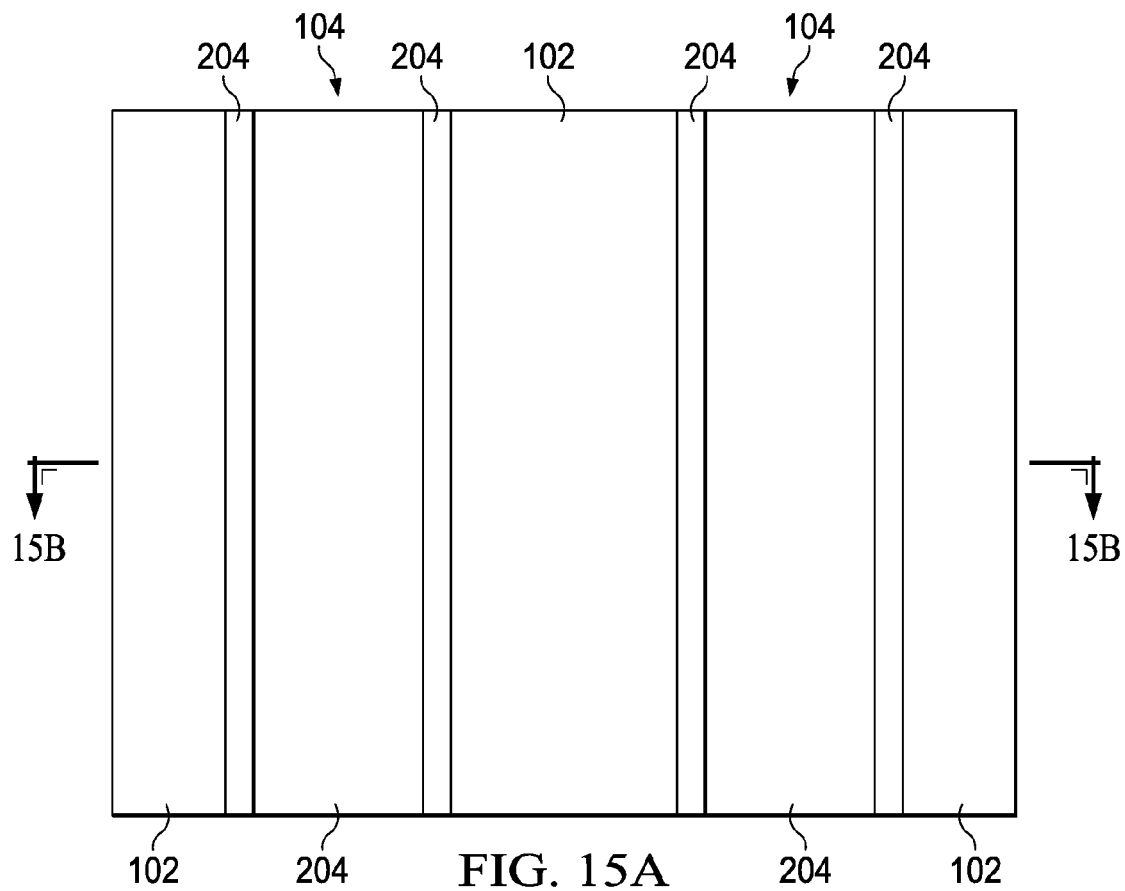
Figure 15B:
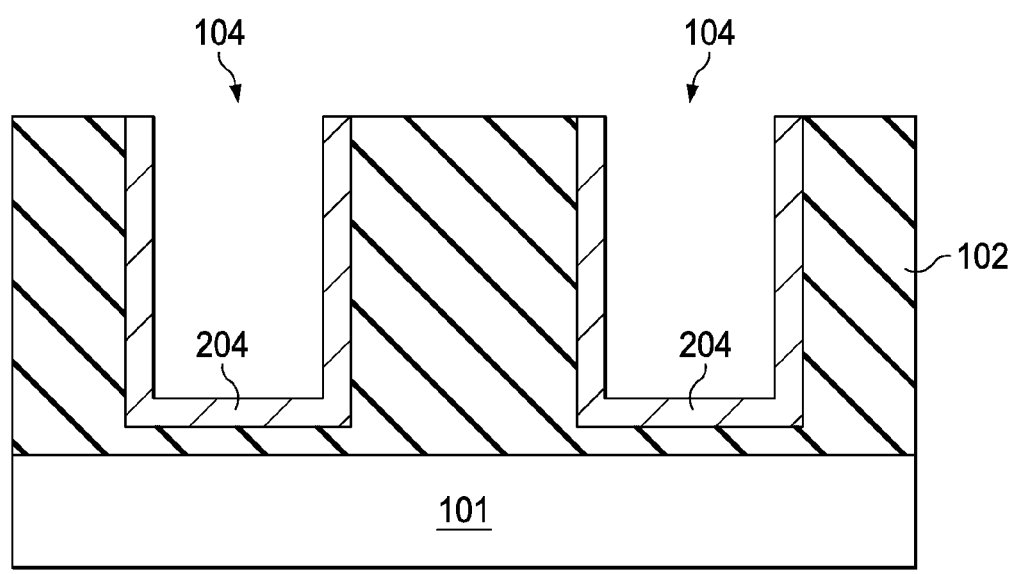

Referring now to FIGS. 15A and 15B, portions of the 2D material layer 204 extending over an upper surface of the first insulating layer 102 is removed in accordance with some embodiments. In some embodiments, a CMP process is performed to remove the 2D material layer 204 from an upper surface of the first insulating layer 102. As a result of this process, the 2D material layer 204 remains along sidewalls of the trenches and is removed from the horizontal surfaces, thereby forming separated strips of the 2D material layer 204 within the trenches 104.

Figure 16A:
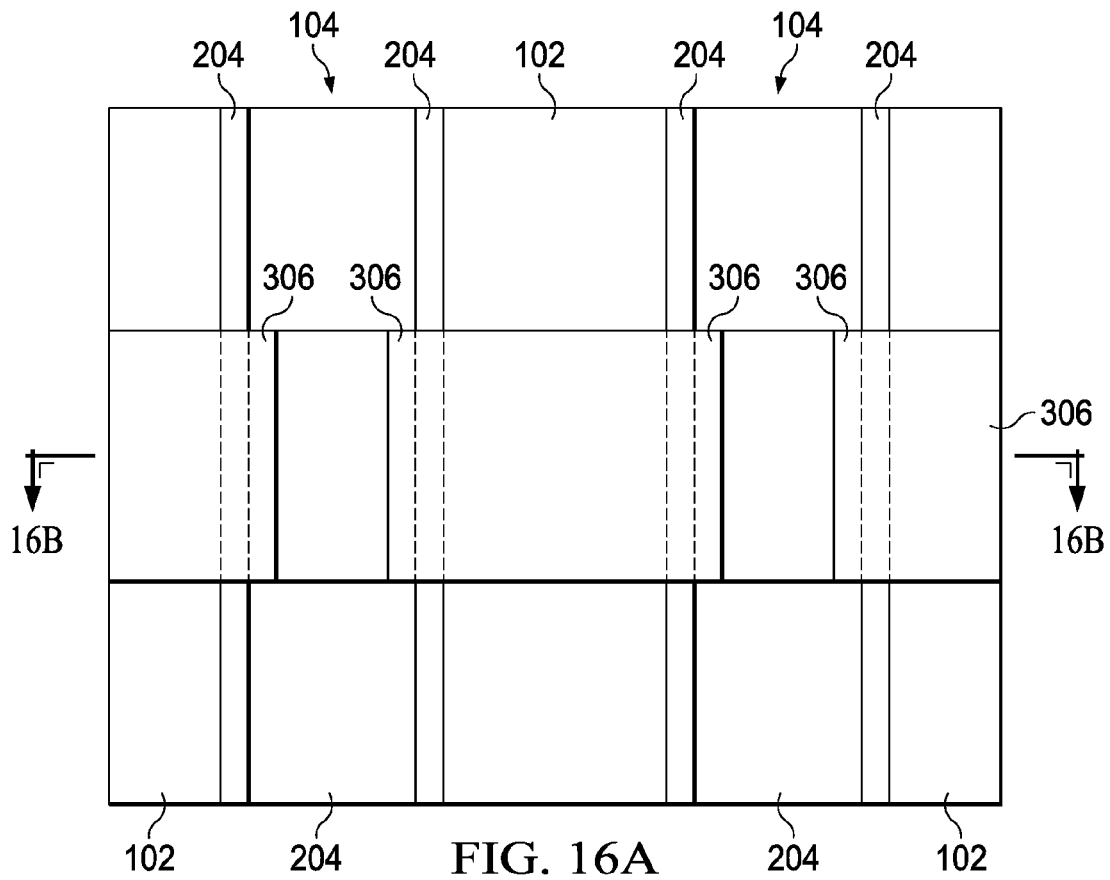
Figure 16B:
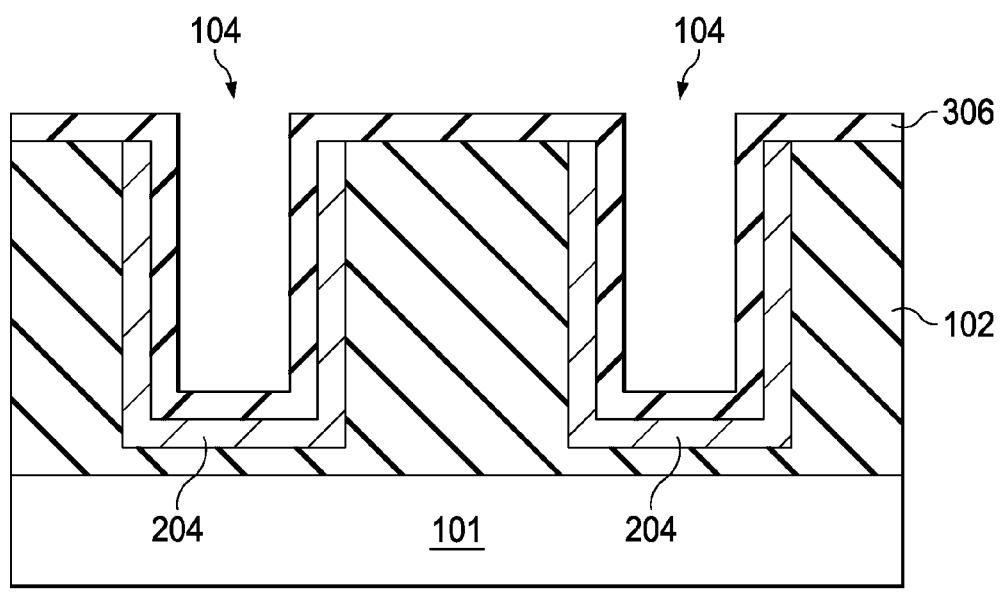

Referring now to FIGS. 16A and 16B, there is formed over the 2D material layer 204 a second dielectric layer 306 in accordance with some embodiments. As will be explained in greater detail below, a gate electrode will be formed over the second dielectric layer 306, such that the second dielectric layer 306 acts as a gate dielectric layer. In some embodiment, the second dielectric layer 306 includes one or more high-k dielectric layers. Similar processes and similar materials as those discussed above may be used, although different processes and/or materials may also be used. In an embodiment, the second dielectric layer 306 may have a thickness of about 1 nm to about 3 nm.

Figure 17A:
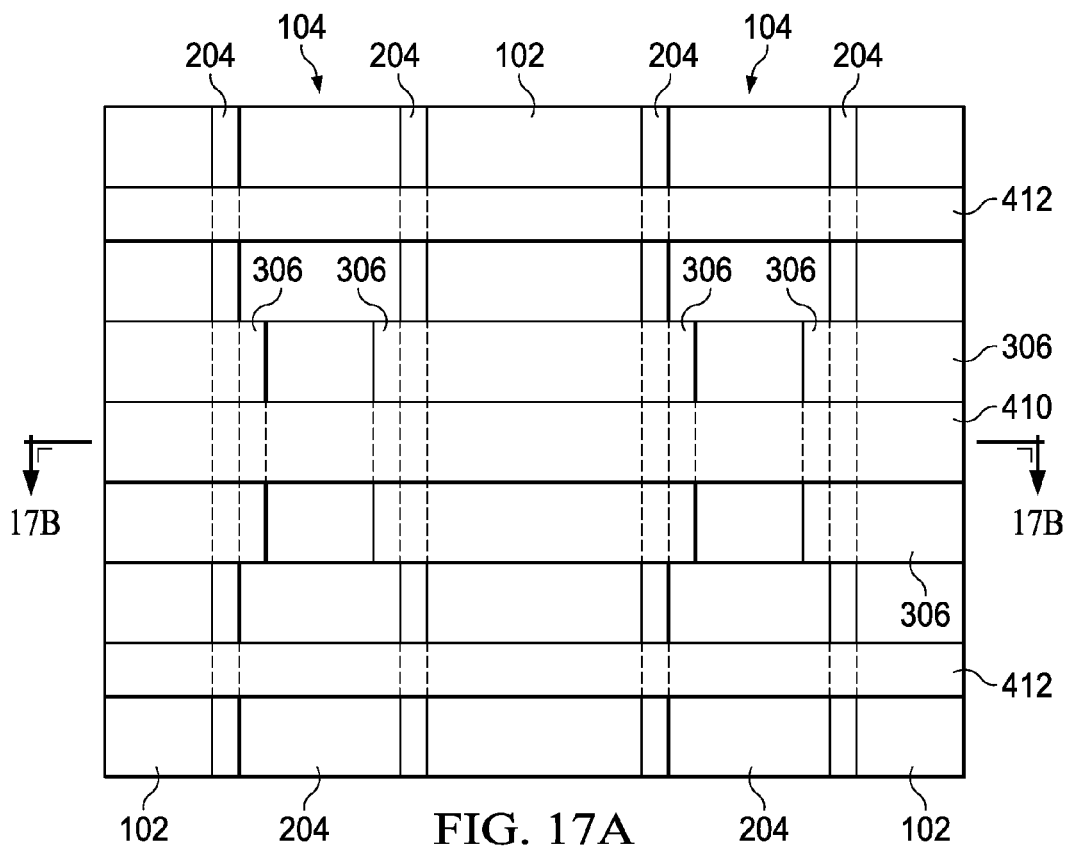
Figure 17B:
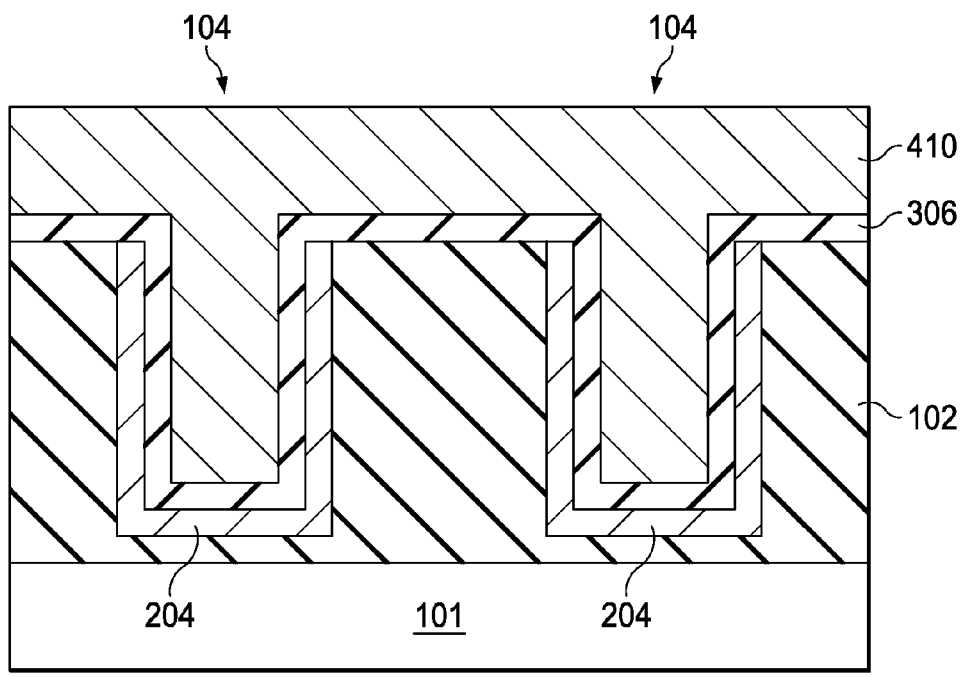

Referring to FIGS. 17A and 17B, a gate electrode 410 and source/drain contacts 412 are formed in the first ILD layer 414, in accordance with some embodiments. The gate electrode 410 and the source/drain contacts 412 may be formed and patterned using similar processes and materials as those discussed above, although different processes and/or materials may also be used.

Figure 18A:
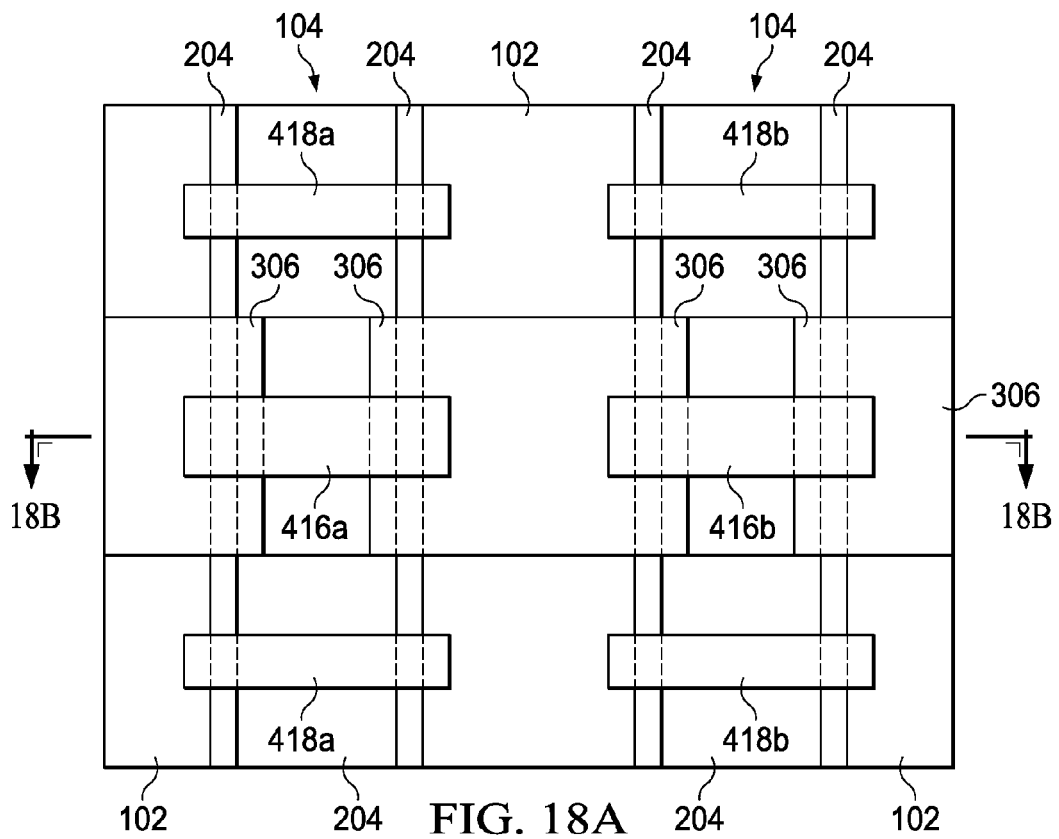
FIGS. 18A-18B illustrate a plan view and a cross-sectional view of a device in accordance with some embodiments.
Figure 18B:
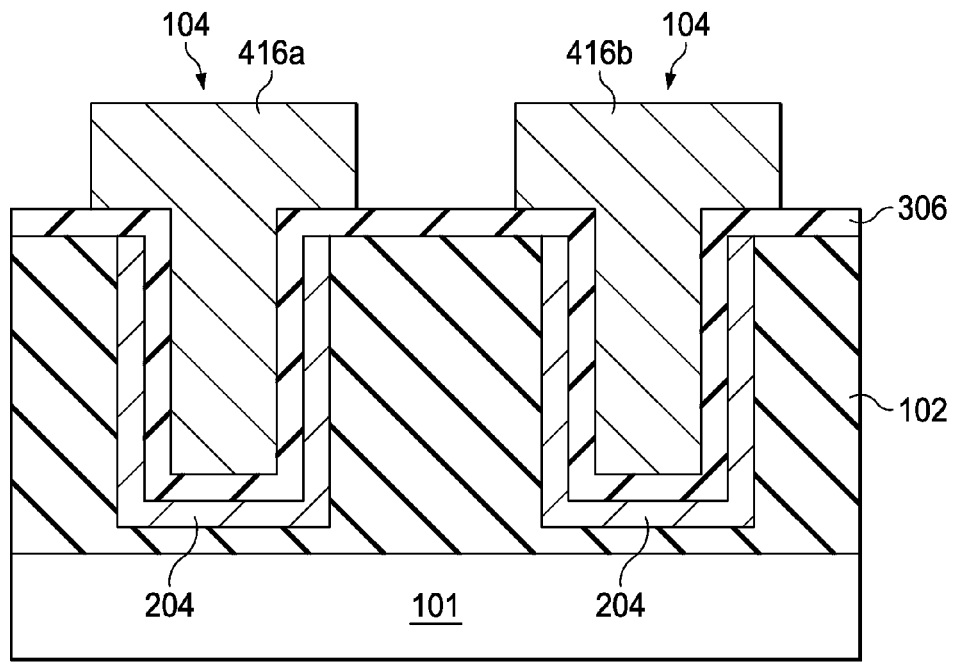

FIGS. 17A and 17B illustrate an embodiment in which a common gate electrode and common source/drain contacts are used. In some embodiments, such as that illustrated in FIGS. 18A and 18B, separate gate electrodes and separate source/drain contacts may be used. For example, FIGS. 18A and 18B illustrates gate electrodes 416a-416b and source/drain contacts 418a-418b. Embodiments such as these provide four separate transistors. Other embodiments may utilize a combination of common gate electrodes and/or common source/drain contacts between two of more of the separate transistors as part of forming a circuit for a particular application.

It should also be noted that additional layers, such as barrier layers, liners, adhesion layers and the like may also be included.

Figure 19A:
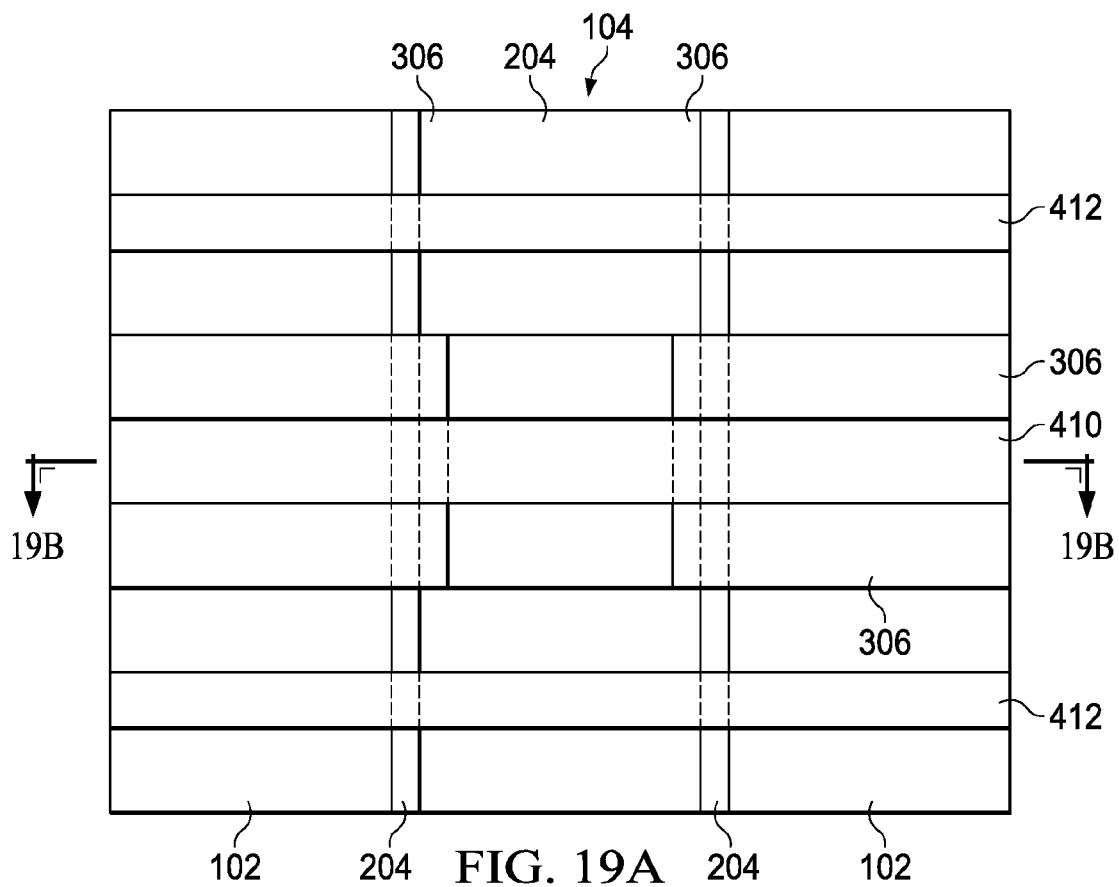
FIGS. 19A-19B illustrate a plan view and a cross-sectional view of a device in accordance with some embodiments.
Figure 19B:
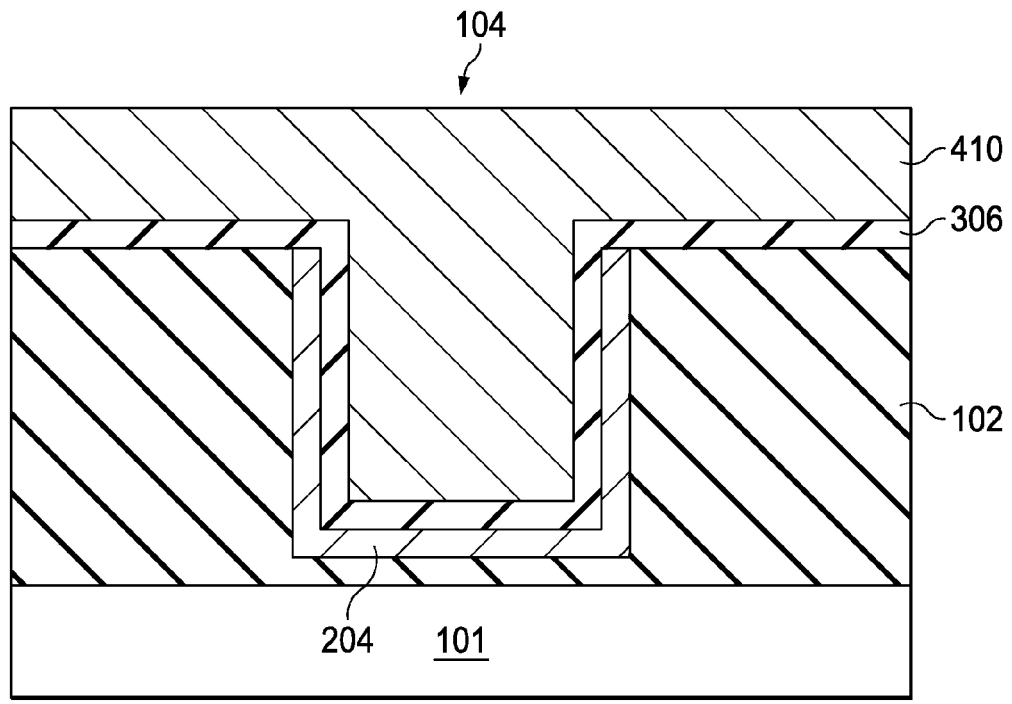

Embodiments such as that discussed above illustrate an embodiment in which two trenches are formed for illustrative purposes only. In other embodiments, more or fewer trenches, and hence more or fewer vertical transistor structures may be provided. For example, FIGS. 19A and 19B illustrate a plan view and a cross-sectional view, respectively, of an embodiment in which a single trench is formed, wherein like reference numerals refer to like elements.

Embodiments such as those discussed above relate to the use of 2D materials on 3D features to create transistors. Other embodiments may utilize 2D materials on 3D features to create other structures. For example, any of the 3D structures with the 2D material layer formed thereon discussed above may be utilized as a conductive line. As an example, the structure discussed above with reference to, for example, FIGS. 2A/2B, 8A/8B, and 15A/15B may be used as conductive lines.

Figure 20:
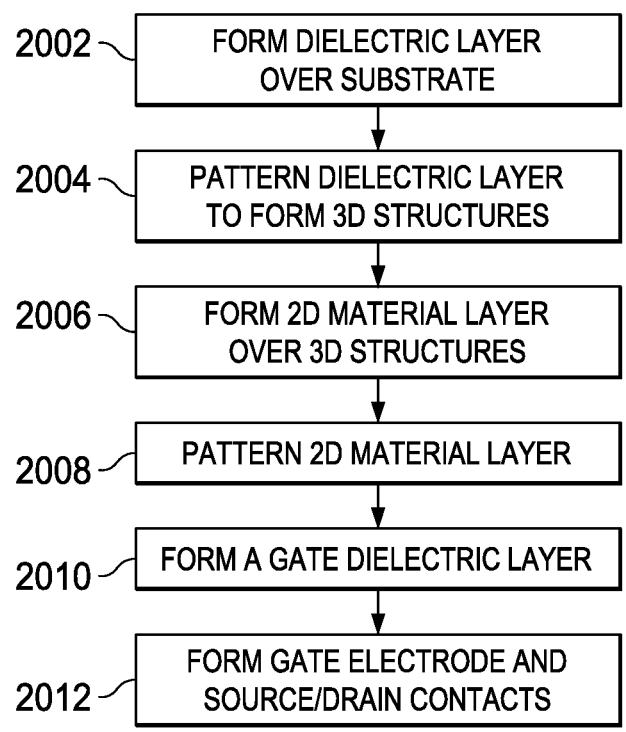
FIG. 20 is a flow diagram illustrating a method of forming a device in accordance with some embodiments.

FIG. 20 is a flow diagram illustrating a process of fabricating a device in accordance with some embodiments. The process begins in step 2002, wherein a dielectric layer is formed over a substrate. The dielectric layer may be formed as described above with reference to the first dielectric layer 102. In step 2004, the dielectric layer is patterned to form a 3D structure, such as trenches (see, e.g., FIGS. 1A/1B, 6A/6B, and 13A/13B) or fins (see, e.g., FIGS. 5A-5D). The dielectric layer may be patterned to exhibit trenches, which may extend partially through the dielectric layer or completely through the dielectric layer to the underlying substrate as discussed above. The dielectric layer may also be patterned to form one or more fins, such as that illustrated in FIGS. 5A-5D.

Thereafter, in step 2006, a 2D material layer is formed over the 3D structure, such as that illustrated in FIGS. 2A/2B, 7A/7B, and 14A/14B. The 2D material layer may include, for example, one or more monolayers of a material such as graphene, TMDs, and/or BN, such as discussed above with reference to the 2D material layer 204. The 2D material layer may extend along sidewalls of the trenches/fins, along a bottom of the trenches, and/or along an upper surface of the dielectric layer, depending on the desired device characteristics. The 2D material layer may be patterned in step 2008, including removing portions of the 2D material layer extending over an upper surface of the dielectric layer, as illustrated, for example, in FIGS. 8A/8B and 15A/15B.

In step 2010, a gate dielectric, such as the second dielectric layer 306 discussed above, may be formed over the 2D material layer to form a transistor, such as illustrated in FIGS. 3A/3B, 9A/9B, and 16A/16B. In step 2012, one or more a gate electrode and source/drain contacts may be formed, such as gate electrodes 410 and source/drain contacts 412 discussed above with reference to FIGS. 4A/4B, 10A/10B, 11A/11B, 17A/17B, and 18A/18B.

In an embodiment, a semiconductor device is provided. The semiconductor device includes a substrate and a first dielectric layer over the substrate. The first dielectric layer has a trench formed therein, and a two-dimensional (2D) material layer extends along sidewalls of the trench. A second dielectric layer over the 2D material layer. A gate electrode extends over the second dielectric layer, and source/drain contacts are in electrical contact with the 2D material layer on opposing sides of the first gate electrode. In some embodiments, the trench may extend to the substrate. The 2D material layer may or may not extend along a bottom of the trench and/or along an upper surface of the first dielectric layer.

In another embodiment, a semiconductor device is provided. The semiconductor device includes a substrate having a sidewall feature. A two-dimensional (2D) material layer extends along sidewalls of the sidewall feature. A first dielectric layer extends over the 2D material layer, and a gate electrode extends over the first dielectric layer. The substrate with a sidewall feature may include a semiconductor substrate having a dielectric layer formed thereon. The sidewall feature may be a sidewall of a trench or a fin. The 2D material layer may or may not extend along a bottom of the trench and/or along an upper surface of the first dielectric layer.

In yet another embodiment, a method of forming a semiconductor device is provided. The method includes providing a substrate having a first dielectric layer formed thereon. A feature having sidewalls is formed in the first dielectric layer. A 2D material layer is formed over the sidewalls of the feature. A second dielectric layer is formed over the 2D material layer, and a gate electrode is formed over the second dielectric layer. The feature having sidewalls may be a trench or a fin. Examples of the 2D material layer includes graphene, TMDs, or BN.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a first dielectric layer over the substrate, the first dielectric layer having a first trench;
a two-dimensional (2D) material layer along sidewalls of the first trench;
a second dielectric layer over the 2D material layer;
a first gate electrode over the second dielectric layer; and source and drain contacts in electrical contact with the 2D material layer on opposing sides of the first gate electrode.

2. The semiconductor device of claim 1, wherein the first trench extends to the substrate.

3. The semiconductor device of claim 1, wherein the 2D material layer extends along a bottom of the first trench.

4. The semiconductor device of claim 1, wherein the 2D material layer extends over an upper surface of the first dielectric layer on opposing sides of the first trench.

5. The semiconductor device of claim 1, wherein a portion of the first dielectric layer extends along a bottom of the first trench.

6. The semiconductor device of claim 1, wherein the first dielectric layer has a second trench and wherein the 2D material layer extends continuously along sidewalls of the first trench and the second trench.

7. The semiconductor device of claim 1, wherein the 2D material layer does not extend along a bottom of the first trench.

8. A semiconductor device comprising:
 a substrate having a sidewall feature;
 a two-dimensional (2D) material layer along sidewalls of the sidewall feature, the 2D material layer extending laterally along the sidewalls in a first direction and a second direction, the first direction being perpendicular to the second direction;
 a first dielectric layer over the 2D material layer; and
 a gate electrode over the first dielectric layer.

9. The semiconductor device of claim 8, wherein the 2D material layer comprises graphene.

10. The semiconductor device of claim 8, wherein the 2D material layer comprises a transition metal dichalcogenide (TMD).

11. The semiconductor device of claim 8, wherein the substrate comprises an underlying substrate having a second dielectric layer thereon, wherein the sidewall feature comprises sidewalls of a trench in the second dielectric layer.

12. The semiconductor device of claim 11, wherein the trench extends to the underlying substrate and the 2D material layer extends along sidewalls of the trench, the 2D material layer terminating at a bottom of the trench.

13. The semiconductor device of claim 11, wherein a portion of the second dielectric layer is interposed between a bottom of the trench and the underlying substrate.

14. The semiconductor device of claim 13, wherein the 2D material layer extends along a bottom of the trench.

15. The semiconductor device of claim 8, wherein the substrate comprises an underlying substrate having a second dielectric layer thereon, wherein the second dielectric layer comprises a fin extending away from the underlying substrate, the 2D material layer extending along sidewalls of the fin.

16. The semiconductor device of claim 15, wherein the second dielectric layer extends along a surface of the semiconductor substrate away from the fin, and wherein 2D material layer extends along a surface of the second dielectric layer away from the fin.

17. A method of forming a semiconductor device, the method comprising:
 providing a substrate having a first dielectric layer formed thereon;
 forming a fin in the first dielectric layer, the fin having sidewalls;
 forming a two-dimensional (2D) material layer over the sidewalls of the fin;
 forming a second dielectric layer over the 2D material layer; and
 forming a gate electrode over the second dielectric layer.

18. The method of claim 17, wherein the 2D material layer comprises graphene, a transition metal dichalcogenide (TMD), or BN.

19. The method of claim 17, wherein the 2D material extends over an upper surface of the fin.

20. The method of claim 17, wherein the 2D material extends over a surface of the first dielectric layer extending away from the fin.

* * * * *